(12) United States Patent
Honda et al.

(10) Patent No.: US 11,190,154 B2
(45) Date of Patent: Nov. 30, 2021

(54) POWER AMPLIFIER CIRCUIT

(71) Applicant: Murata Manufacturing Co., Ltd., Kyoto (JP)

(72) Inventors: Yuri Honda, Kyoto (JP); Satoshi Goto, Kyoto (JP); Fumio Harima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/898,907

(22) Filed: Jun. 11, 2020

(65) Prior Publication Data

US 2020/0395902 A1 Dec. 17, 2020

(30) Foreign Application Priority Data

Jun. 14, 2019 (JP) .............. JP2019-111340
Feb. 17, 2020 (JP) .............. JP2020-024386

(51) Int. Cl.
| | |
|---|---|
| H03F 1/07 | (2006.01) |
| H03F 3/24 | (2006.01) |
| H03F 3/195 | (2006.01) |
| H03F 1/56 | (2006.01) |

(52) U.S. Cl.
CPC ............ H03F 3/245 (2013.01); H03F 1/565 (2013.01); H03F 3/195 (2013.01); *H03F 2200/378* (2013.01); *H03F 2200/423* (2013.01); *H03F 2200/451* (2013.01); *H03F 2200/537* (2013.01)

(58) Field of Classification Search
CPC ..................... H03F 1/07; H03F 1/02

USPC .............................. 330/124 R, 295
See application file for complete search history.

(56) References Cited

U.S. PATENT DOCUMENTS

| | | | | |
|---|---|---|---|---|
| 5,757,229 A | * | 5/1998 | Mitzlaff | H03G 3/3042 330/124 R |
| 6,262,629 B1 | * | 7/2001 | Stengel | H03F 1/0261 330/124 R |
| 7,936,212 B2 | * | 5/2011 | Pengelly | H03F 3/604 330/124 R |
| 8,508,296 B1 | * | 8/2013 | Mustafa | H03F 1/565 330/124 R |
| 2012/0262236 A1 | | 10/2012 | Shirai | |

FOREIGN PATENT DOCUMENTS

| | | |
|---|---|---|
| JP | S58-030315 U | 2/1983 |
| JP | 2006-203635 A | 8/2006 |
| JP | 2012-227568 A | 11/2012 |

* cited by examiner

*Primary Examiner* — Henry Choe
(74) *Attorney, Agent, or Firm* — Pearne & Gordon LLP

(57) ABSTRACT

A power amplifier circuit includes a power splitter, a first amplifier configured to output a first amplified signal from a first output terminal, and a second amplifier configured to output a second amplified signal from a second output terminal. The power amplifier circuit further includes a first termination circuit connected between the first output terminal and the second output terminal, a first transmission line, a second transmission line, a second termination circuit connected between another end of the first transmission line and another end of the second transmission line, and a power combiner.

20 Claims, 16 Drawing Sheets

POWER AMPLIFIER CIRCUIT

This application claims priority from Japanese Patent Application No. 2019-111340 filed on Jun. 14, 2019 and Japanese Patent Application No. 2020-024386 filed on Feb. 17, 2020. The content of each of these applications are incorporated herein by reference in its entirety.

BACKGROUND

The present disclosure relates to a power amplifier circuit. In communications in mobile units, such as cellular phones, a power amplifier circuit is used that amplifies a radio frequency (RF) signal. In the power amplifier circuit, increased efficiency has to be achieved.

Japanese Unexamined Patent Application Publication No. 2006-203635 discloses a power amplifier circuit that amplifies RF signals in different frequency bands by using one amplifier block. In the power amplifier circuit disclosed in Japanese Unexamined Patent Application Publication No. 2006-203635, an input signal is split into two signals with different phases by a signal splitter. In the power amplifier circuit, the respective signals are amplified by two respective amplifiers and then combined by a power combiner whose behavior differs according to frequency bands.

In the power amplifier circuit disclosed in Japanese Unexamined Patent Application Publication No. 2006-203635, the signals output from the respective amplifiers differ in phase by about 180°. At this time, even harmonics output from the respective amplifiers cancel each other out in the power combiner and are therefore not output from the power amplifier circuit. Furthermore, a third harmonic included in odd harmonics is attenuated by a resonant circuit provided in the power combiner.

In the power amplifier circuit disclosed in Japanese Unexamined Patent Application Publication No. 2006-203635, odd harmonics with frequencies higher than a frequency of the third harmonic are not attenuated. In this case, an odd harmonic that is not attenuated is included in an output signal, resulting in a condition where an undesired signal is included in an output of the power amplifier circuit.

In the case where the operating class of an amplifier is caused to be, for example, class E operation that enables an increase in efficiency, even and odd harmonics have to be adjusted. When an impedance as seen from the amplifier at a third harmonic frequency is not caused to be an open-circuit impedance, the amplifier departs from an ideal condition in the class E operation. Thus, an unnecessary signal is also output from the power amplifier circuit, resulting in a reduction in the power efficiency of the power amplifier circuit.

BRIEF SUMMARY

The present disclosure has been made in consideration of such circumstances and provides a power amplifier circuit that amplifies power by using a differential amplifier configuration and that achieves high efficiency by reducing output of an unnecessary signal.

According to embodiments of the present disclosure, a power amplifier circuit includes a power splitter configured to receive an input signal through an input terminal and output a first signal and a second signal that differ in phase from each other; a first amplifier having a first input terminal and a first output terminal and configured to output, from the first output terminal, a first amplified signal obtained by amplifying the first signal input from the first input terminal; a second amplifier having a second input terminal and a second output terminal and configured to output, from the second output terminal, a second amplified signal obtained by amplifying the second signal input from the second input terminal; a first termination circuit including a capacitor connected between the first output terminal and the second output terminal; a first transmission line having one end connected to the first output terminal of the first amplifier; a second transmission line having one end connected to the second output terminal of the second amplifier; a second termination circuit including a capacitor and an inductor that are connected between another end of the first transmission line and another end of the second transmission line; and a power combiner connected to the other end of the first transmission line and the other end of the second transmission line and configured to output an output signal obtained by combining the first amplified signal and the second amplified signal. A capacitance value of the capacitor of the first termination circuit is lower than a capacitance value of the capacitor of the second termination circuit. An odd harmonic of the output signal has been attenuated so that a ratio of the odd harmonic to a fundamental in the output signal is smaller than a ratio of the odd harmonic to the fundamental in the input signal.

The present disclosure can provide the power amplifier circuit that amplifies power by using a differential amplifier configuration and that achieves high efficiency by reducing output of an unnecessary signal.

Other features, elements, characteristics and advantages of the present disclosure will become more apparent from the following detailed description of embodiments of the present disclosure with reference to the attached drawings.

DETAILED DESCRIPTION

Figure 1:
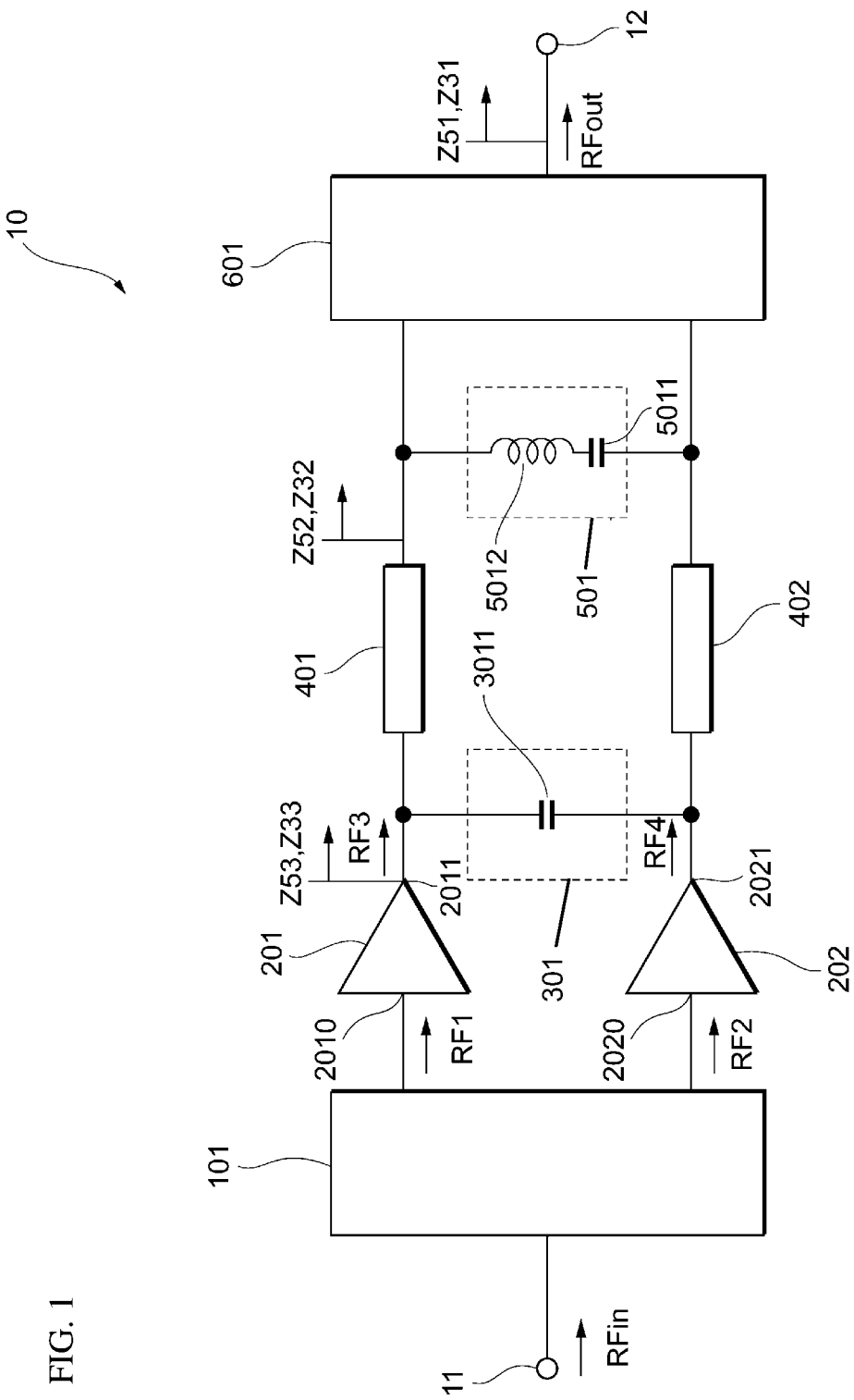
FIG. 1 is a circuit diagram of a power amplifier circuit according to a first embodiment.

Embodiments of the present disclosure will be described in detail below with reference to the drawings. The same elements are denoted by the same reference numerals, and a repeated description thereof is omitted as much as possible.

A power amplifier circuit 10 according to a first embodiment will be described. FIG. 1 is a circuit diagram of the power amplifier circuit 10. The power amplifier circuit 10 includes a power splitter 101, amplifiers 201 and 202, termination circuits 301 and 501, transmission lines 401 and 402, and a power combiner 601.

The power splitter 101 is connected to an input terminal 11, an input terminal 2010 of the amplifier 201, and an input terminal 2020 of the amplifier 202. The power splitter 101 generates a signal RF1 and a signal RF2 from an input signal RFin from the input terminal 11. The signal RF1 and the signal RF2 differ in phase by about 180°. The power splitter 101 respectively supplies the signal RF1 and the signal RF2 to the amplifier 201 and the amplifier 202. The power splitter 101 may output the signal RF1 and the signal RF2 through a matching network that adjusts impedances between the power splitter 101 and the amplifiers 201 and 202.

Each of the amplifier 201 and the amplifier 202 is connected to the power splitter 101. An output terminal 2011 from which a signal from the amplifier 201 is output is connected to the termination circuit 301 and one end of the transmission line 401. The amplifier 201 generates an amplified signal RF3 obtained by amplifying the signal RF1. The amplified signal RF3 corresponds to a first amplified signal.

An output terminal 2021 from which a signal from the amplifier 202 is output is connected to the termination circuit 301 and one end of the transmission line 402. The amplifier 202 generates an amplified signal RF4 obtained by amplifying the signal RF2. The amplified signal RF4 corresponds to a second amplified signal.

A phase difference between the amplified signal RF3 and the amplified signal RF4 is the same as a phase difference between the signal RF1 and the signal RF2. In this case, a phase difference between the amplified signal RF3 and the amplified signal RF4 is ideally about 180°.

The termination circuit 301 is connected between the output terminal 2011 and the output terminal 2021. The termination circuit 301 includes a capacitor 3011. One end of the capacitor 3011 is connected to the output terminal 2011. The other end of the capacitor 3011 is connected to the output terminal 2021.

The termination circuit 301 functions as a low pass filter that passes a signal in a frequency band lower than a frequency of a fifth harmonic. In other words, the termination circuit 301 attenuates fifth harmonics included in the amplified signal RF3 and the amplified signal RF4. In the present disclosure, a value of an output level attenuated with respect to an output level of a fundamental by not less than about 45 dBc is defined as attenuation.

The one end of the transmission line 401 is connected to the output terminal 2011 and the one end of the capacitor 3011. The other end of the transmission line 401 is connected to the termination circuit 501 and the power combiner 601.

The one end of the transmission line 402 is connected to the output terminal 2021 and the other end of the capacitor 3011. The other end of the transmission line 402 is connected to the termination circuit 501 and the power combiner 601. Each of the transmission lines 401 and 402 is, for example, a strip line or microstrip line provided in or on a substrate.

Each of the transmission line 401 and the transmission line 402 functions as an impedance conversion element that converts impedance in the power amplifier circuit 10.

The termination circuit 501 is connected between the other end of the transmission line 401 and the other end of the transmission line 402. The termination circuit 501 includes a capacitor 5011 and an inductor 5012. A capacitance value of the capacitor 3011 for attenuating a fifth harmonic is lower than a capacitance value of the capacitor 5011 for attenuating a third harmonic.

One end of the inductor 5012 is connected to the other end of the transmission line 401. The other end of the inductor 5012 is connected to one end of the capacitor 5011. The other end of the capacitor 5011 is connected to the other end of the transmission line 402.

In the termination circuit 501, an LC series resonant circuit is constituted by the capacitor 5011 and the inductor 5012. The termination circuit 501 reduces an impedance of the LC series resonant circuit at a frequency of third harmonics of the amplified signal RF3 and the amplified signal RF4 and thereby causes an impedance mismatch. When an impedance mismatch is caused, third harmonics are kept from being output from the output terminals 2011 and 2021.

Specifically, when an impedance mismatch is caused by reducing an impedance, the termination circuit 501 functions in such a manner as to cause a harmonic component to be reflected. A third harmonic caused to be reflected by the termination circuit 501 is combined with a third harmonic to be output from the power amplifier circuit 10 to generate a standing wave. This keeps third harmonics from being output from the output terminals 2011 and 2021.

The power combiner 601 is connected to an output terminal 12, the other end of the transmission line 401, the other end of the transmission line 402, and the termination circuit 501. The power combiner 601 combines the amplified signal RF3 and the amplified signal RF4 and outputs a signal RFout as an output signal from the output terminal 12.

In the case of an odd harmonic, such as a third harmonic or fifth harmonic, attenuation in the present disclosure is determined by measuring a ratio of an odd harmonic component to a fundamental component in the signal RFout, which is the input signal RFin that has been input to the power amplifier circuit 10 and then amplified and output. That is, the case where a ratio of an odd harmonic component to a fundamental component in the signal RFout becomes smaller than a ratio of the odd harmonic component to the fundamental component in the input signal RFin is represented as "the odd harmonic is attenuated".

Figure 2:
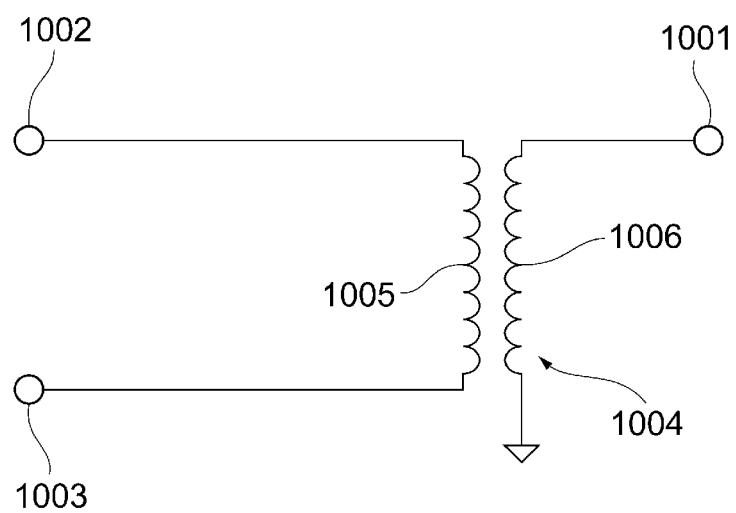
FIG. 2 is a circuit diagram of each of a power splitter and a power combiner in the power amplifier circuit.

A circuit configuration of each of the power splitter 101 and the power combiner 601 will be described with reference to FIG. 2. FIG. 2 is a circuit diagram of each of the power splitter 101 and the power combiner 601. The power splitter 101 and the power combiner 601 have the same configuration, and power splitting or power combining is performed in accordance with a connection method. Each of the power splitter 101 and the power combiner 601 includes terminals 1001, 1002, 1003, and a transformer 1004. The transformer 1004 includes inductors 1005 and 1006. A transmission line (wiring line) may be used in place of an inductor.

One end of the inductor 1005 is connected to the terminal 1002. The other end of the inductor 1005 is connected to the terminal 1003. The terminal 1001 is connected to one end of the inductor 1006. The other end of the inductor 1006 is grounded.

In the case where the circuit illustrated in FIG. 2 is used as the power splitter 101, the terminal 1001 is connected to the input terminal 11. The terminal 1002 is connected to the input terminal 2010 of the amplifier 201. The terminal 1003 is connected to the input terminal 2020 of the amplifier 202.

A signal input to the terminal 1001 is output to the terminal 1002 and the terminal 1003 through the transformer 1004.

A phase difference between a signal output from the terminal 1002 and a signal output from the terminal 1003 is about 180°. In some cases, the phase difference may deviate from about 180° due to the imbalance between wiring line lengths in the circuit or the like.

In the case where the circuit illustrated in FIG. 2 is used as the power combiner 601, the terminal 1001 is connected to the output terminal 12. The terminal 1002 is connected to the other end of the transmission line 401 and the termination circuit 501. The terminal 1003 is connected to the other end of the transmission line 402 and the termination circuit 501.

In the power combiner 601, a signal input to the terminal 1002 and a signal input to the terminal 1003 are output to the terminal 1001 through the transformer 1004.

A phase difference between the signal input to the terminal 1002 and the signal input to the terminal 1003 is about 180°, and a voltage with twice the amplitude of the signal input to the terminal 1002 is therefore applied to the inductor 1005. When the signals are transmitted to the terminal 1001 by using this voltage, power is combined. In some cases, the phase difference between the input signals may deviate from about 180°.

The operation of the power amplifier circuit 10 will be described. The input signal RFin input to the power amplifier circuit 10 is supplied to the power splitter 101. In the power splitter 101, the input signal RFin is split into the signal RF1 and the signal RF2 that differ in phase from each other by about 180°.

The signal RF1 is supplied from the power splitter 101 to the input terminal 2010 of the amplifier 201. The signal RF2 is supplied from the power splitter 101 to the input terminal 2020 of the amplifier 202. The amplifier 201 outputs the amplified signal RF3 obtained by amplifying the signal RF1 from the output terminal 2011. The amplifier 202 outputs the amplified signal RF4 obtained by amplifying the signal RF2 from the output terminal 2021.

The amplified signal RF3 and the amplified signal RF4 include a second or higher even harmonic and a third or higher odd harmonic.

A phase difference between the amplified signal RF3 and the amplified signal RF4 is about 180°. For this reason, when the amplified signal RF3 and the amplified signal RF4 are combined in the power combiner 601, even harmonics of the amplified signal RF3 and the amplified signal RF4 cancel each other out. That is, neither of the even harmonics of the amplified signal RF3 and the amplified signal RF4 is output from the output terminal 12.

Figure 3:
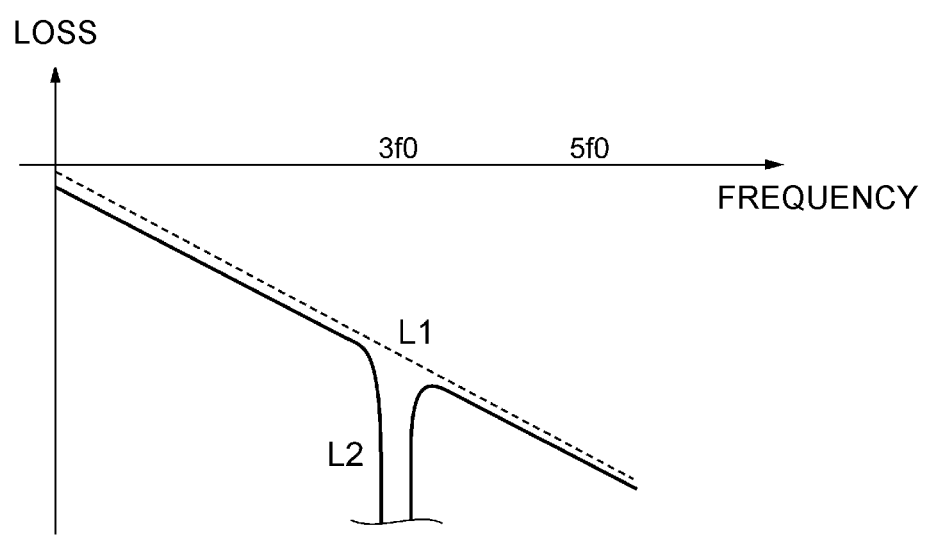
FIG. 3 is a graph of a frequency response of the power amplifier circuit according to the first embodiment.

FIG. 3 illustrates a frequency response exhibited before, of the amplified signal RF3 and the amplified signal RF4, an odd harmonic of the amplified signal RF3 reaches the power combiner 601. The following description of the amplified signal RF3 holds for the amplified signal RF4. For signs on the horizontal axis in a graph, 3f0 corresponds to a frequency of a third harmonic, and 5f0 corresponds to a frequency of a fifth harmonic.

In FIG. 3, loss L1 of a high-frequency wave exhibited when a path from the amplifier 201 to the termination circuit 301 is considered and loss L2 exhibited when a path from the amplifier 201, to the termination circuit 301, to the transmission line 401, and then to the termination circuit 501 is considered are represented.

The loss L1 represents that a fifth harmonic has been attenuated by the termination circuit 301. The loss L2 represents that a third harmonic has been attenuated to a large degree by the termination circuit 501.

Figure 4:
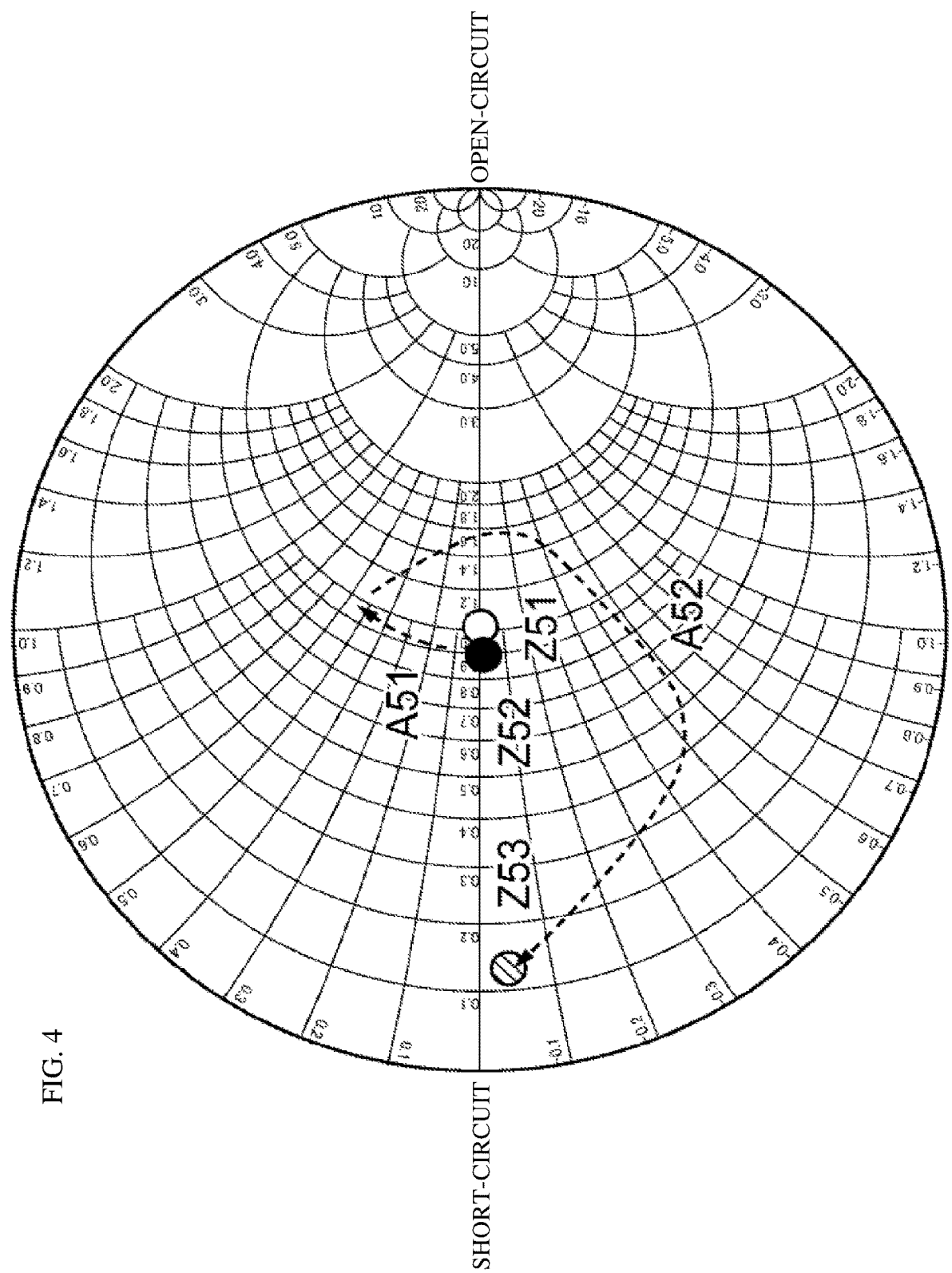
FIG. 4 is a Smith chart illustrating an example of impedance in the power amplifier circuit according to the first embodiment.

Attenuations of a third harmonic and a fifth harmonic of the amplified signal RF3 will be described from the viewpoint of impedance with reference to FIGS. 4 and 5. In a Smith chart in FIG. 4, at a frequency of a fifth harmonic, an impedance Z51 as seen from the power combiner 601 looking into the output terminal 12, an impedance Z52 as seen from the other end of the transmission line 401 looking into the output terminal 12, and an impedance Z53 as seen from the output terminal 2011 looking into the output terminal 12 are represented.

In this and subsequent embodiments, "open-circuit side" refers to an open-circuit impedance side located in the rightmost portion of a Smith chart. Furthermore, "short-circuit side" refers to a short-circuit impedance side located in the leftmost portion of the Smith chart.

A transition from the impedance Z51 to the impedance Z53 will be described. The impedance Z51 is located at the center of the chart because impedance matching has been achieved between the power combiner 601 and the output terminal 12. The impedance Z52 is affected by the power combiner 601 and the termination circuit 501 that terminates a third harmonic and moves slightly from the center to the left side, that is, to a short-circuit side.

A value of the impedance Z53 changes from the impedance Z52 due to a series connection of the transmission line 401 and a parallel connection of the termination circuit 301.

When the transmission line 401 is connected in series, the location of the impedance changes clockwise as represented by a locus A51 and moves to an inductive region, which is the upper half of the chart.

Subsequently, when the termination circuit 301 is connected in parallel, that is, when the capacitor 3011 is connected in parallel, the location of the impedance changes clockwise as represented by a locus A52 and moves to a capacitive region, which is the lower half of the chart. The impedance Z53 moves to the short-circuit side and is located near a short-circuit impedance away from the center of the chart.

A distance from the center of the chart is a reflection coefficient, and thus the farther the impedance is away from the center of the chart, the higher the reflection coefficient is. The impedance Z53 is located closer to a perimeter of the chart than the center of the chart, and it can thus be said that the reflection coefficient is high.

As in the impedance Z53, when a reflection coefficient is high, the fifth harmonic of the amplified signal RF3 is reflected between the termination circuit 301 and the output terminal 2011. The fifth harmonic of the amplified signal RF3 continues to be reflected between the termination circuit 301 and the output terminal 2011 while generating a standing wave and thus does not travel to a power combiner 601 side. In other words, the fifth harmonic of the amplified signal RF3 is terminated by the termination circuit 301. For this reason, the fifth harmonic is attenuated by the termination circuit 301 as illustrated in FIG. 3.

Figure 5:
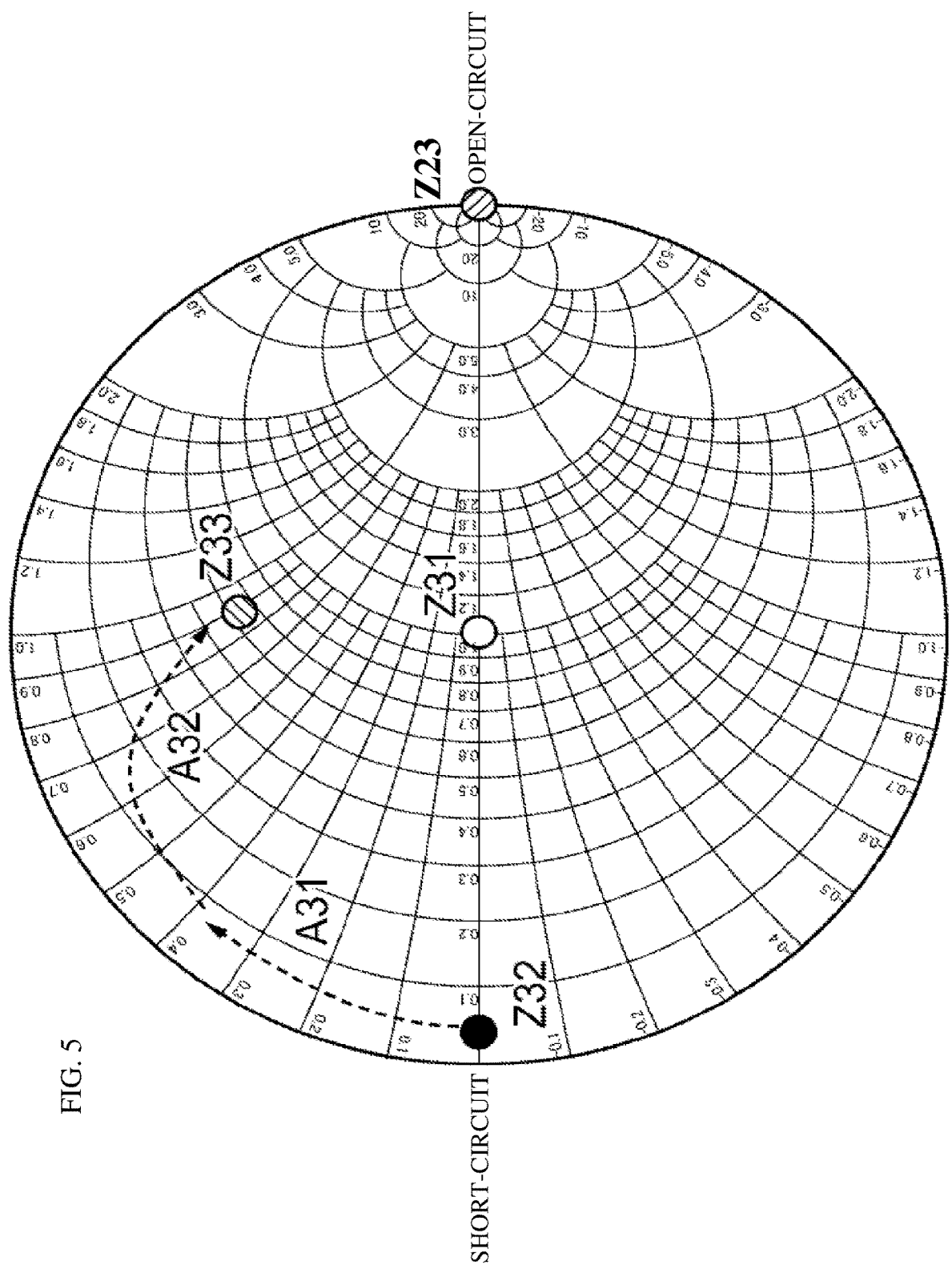
FIG. 5 is a Smith chart illustrating an example of impedance in the power amplifier circuit according to the first embodiment.

In a Smith chart in FIG. 5, at a frequency of a third harmonic, an impedance Z31 as seen from the power combiner 601 looking into the output terminal 12, an impedance Z32 as seen from the other end of the transmission line 401 looking into the output terminal 12, and an impedance Z33 as seen from the output terminal 2011 looking into the output terminal 12 are represented. Furthermore, an impedance Z23 as seen from the output terminal 2011 at a frequency of a second harmonic is represented.

A transition from the impedance Z31 to the impedance Z33 will be described. The impedance Z31 is located at the center of the chart because impedance matching has been achieved between the power combiner 601 and the output terminal 12. The impedance Z32 is located near a short-circuit impedance away from the center of the chart because the termination circuit 501 resonates at the frequency of the third harmonic.

A value of the impedance Z33 changes from the impedance Z32 due to a series connection of the transmission line 401 and a parallel connection of the termination circuit 301.

When the transmission line 401 is connected in series, the location of the impedance changes clockwise as represented by a locus A31 and moves to an inductive region, which is the upper half of the chart.

Subsequently, when the termination circuit 301 is connected in parallel, that is, when the capacitor 3011 is connected in parallel, the location of the impedance changes clockwise as represented by a locus A32 and moves to a location near the center.

The impedance Z33 represents that the third harmonic is attenuated to some degree but not to a large degree by the termination circuit 301. With respect to an impedance at a contact between the transmission line 401 and the termination circuit 501, however, a third harmonic impedance is sufficiently low in comparison with a fundamental impedance, and the reflection coefficient is therefore high, enabling the third harmonic to be attenuated.

The third harmonic of the amplified signal RF3 is reflected between the termination circuit 501 and the output terminal 2011. Of the third harmonic of the amplified signal RF3, a reflected third harmonic continues to be reflected between the termination circuit 501 and the output terminal 2011 while generating a standing wave and thus does not travel to the power combiner 601 side. In other words, the third harmonic of the amplified signal RF3 is terminated by the termination circuit 501. For this reason, the third harmonic is attenuated as illustrated in FIG. 3.

The impedance Z23 will be described. The power amplifier circuit 10 has a differential configuration of the amplifier 201 and the amplifier 202, and a voltage difference between second harmonics is therefore canceled out by the power combiner 601. Since a voltage difference is canceled out, no current flows due to a second harmonic. The fact that no current flows refers to the fact that the impedance Z23 is very high. Thus, the impedance Z23 is located near an open-circuit (infinite) impedance on the chart in FIG. 5. In the present disclosure, an open-circuit impedance is defined as a value about 20 times a normalized impedance (about 50Ω).

In the case where the second harmonic impedance Z23 is an open-circuit impedance, when the third harmonic impedance Z33 is caused to be located on an open-circuit side, the operation of the amplifier 201 gets close to class E operation. When the third harmonic impedance Z33 is caused to be located on the short-circuit side, the operation of the amplifier 201 gets close to inverse class F operation.

In the power amplifier circuit 10, the capacitor 3011 having a predetermined capacitance causes the impedance Z53 to be located near the short-circuit side and the impedance Z33 to be located midway between the open-circuit side and the short-circuit side. The location of the impedance Z33 is changed by the capacitance of the capacitor 3011.

When the capacitance of the capacitor 3011 is adjusted, the fifth harmonic impedance Z53 and the third harmonic impedance Z33 can be adjusted. For example, when the capacitance of the capacitor 3011 is reduced, the lengths of the locus A52 and the locus A32 are reduced. In this case, the impedance Z33 is located closer to the short-circuit side than that illustrated in FIG. 5. In the present disclosure, a short-circuit impedance is defined as a value less than about $\frac{1}{12}$ times a normalized impedance (about 50Ω).

Although an impedance as seen from the output terminal 2011 has been described, the same holds true for an impedance as seen from the output terminal 2021.

In the power amplifier circuit 10, the termination circuit 301 and the termination circuit 501 can attenuate third and higher odd harmonics. Furthermore, when a value of the capacitor 3011 used for attenuating a fifth harmonic is appropriately changed, operating classes of the amplifier 201 and the amplifier 202 can be changed while attenuating a fifth harmonic. When the operating classes of the amplifier 201 and the amplifier 202 are brought close to an ideal operating condition, the efficiency of the power amplifier circuit 10 can be improved.

A power amplifier circuit 10A according to a second embodiment will be described. In second and subsequent embodiments, a description of things in common with the first embodiment is omitted, and only respects in which the second and subsequent embodiments differ from the first embodiment will be described. In particular, similar function effects achieved by similar configurations are not repeatedly described in each embodiment.

Figure 6:
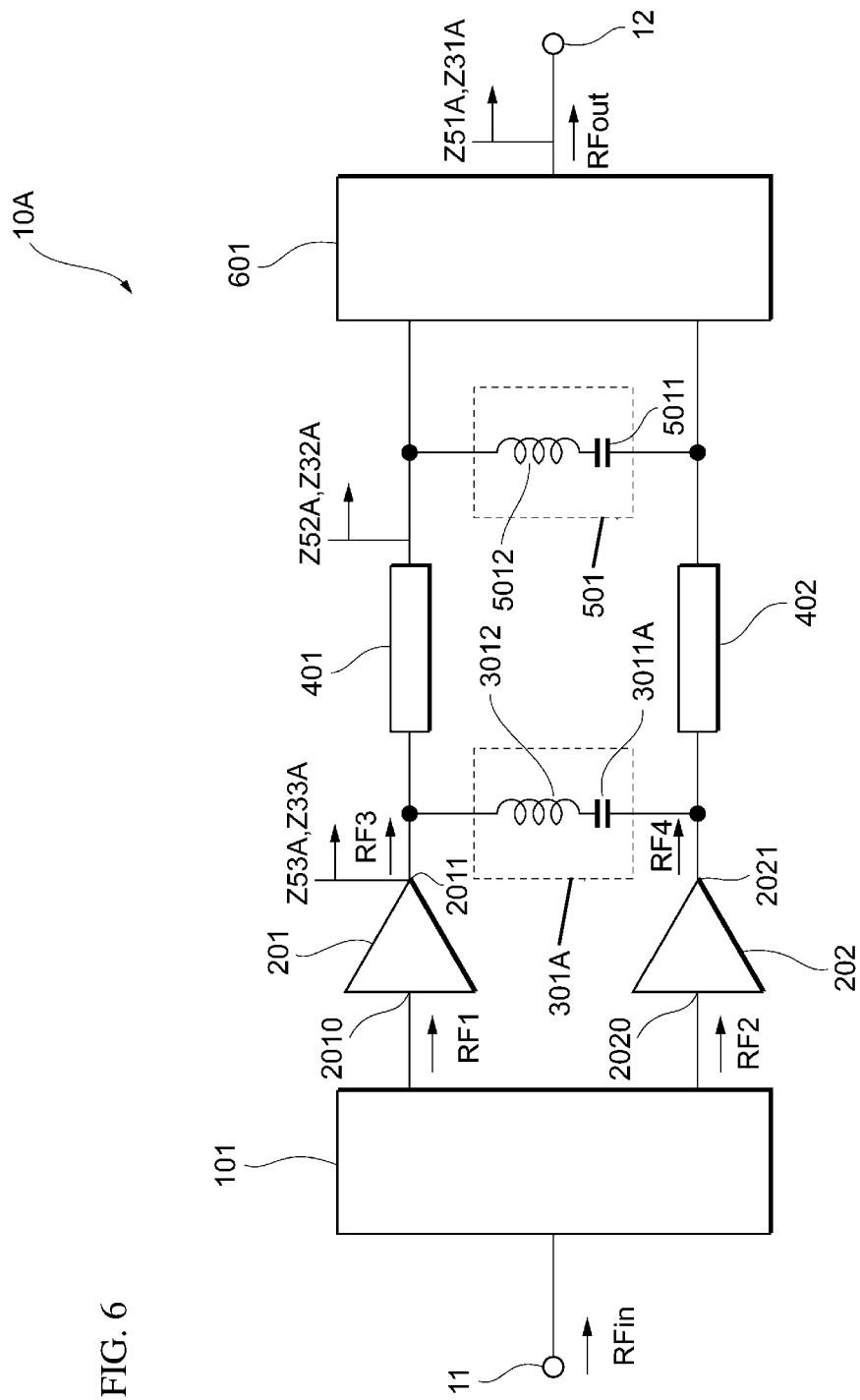
FIG. 6 is a circuit diagram of a power amplifier circuit according to a second embodiment.

As illustrated in FIG. 6, the power amplifier circuit 10A according to the second embodiment differs from the power amplifier circuit 10 in that the power amplifier circuit 10A includes a termination circuit 301A. The termination circuit 301A includes a capacitor 3011A and an inductor 3012.

One end of the inductor 3012 is connected to the output terminal 2011, and the other end is connected to one end of the capacitor 3011A. The other end of the capacitor 3011A is connected to the output terminal 2021.

In the termination circuit 301A, an LC series resonant circuit is constituted by the capacitor 3011A and the inductor 3012. The termination circuit 301A reduces an impedance of the LC series resonant circuit at a frequency of fifth harmonic components of the amplified signal RF3 and the amplified signal RF4 and thereby causes an impedance mismatch. When an impedance mismatch is caused, fifth harmonic components are kept from being output from the output terminals 2011 and 2021.

Figure 7:
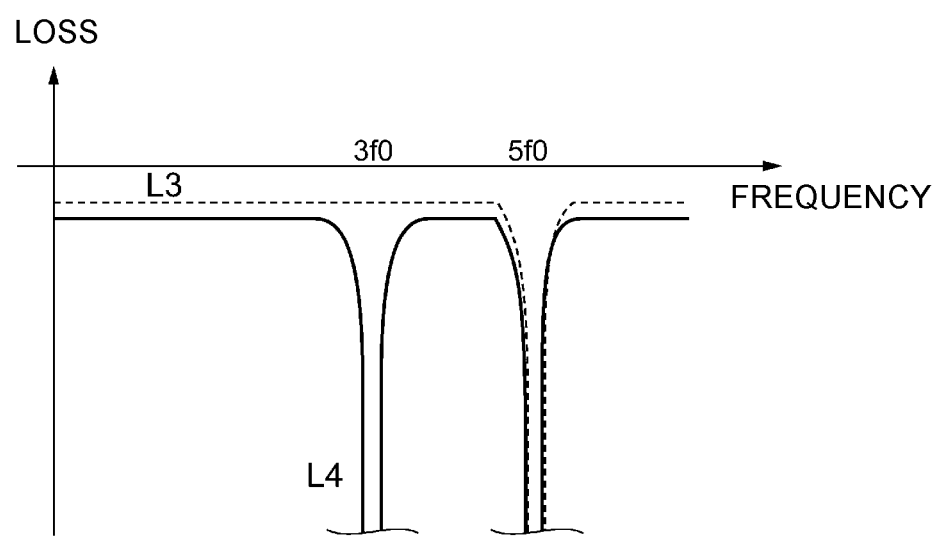
FIG. 7 is a graph of a frequency response of the power amplifier circuit according to the second embodiment.

FIG. 7 illustrates a frequency response exhibited before, of the amplified signal RF3 and the amplified signal RF4, an odd harmonic of the amplified signal RF3 reaches the power combiner 601. For signs on the horizontal axis in a graph, 3f0 corresponds to a frequency of a third harmonic, and 5f0 corresponds to a frequency of a fifth harmonic.

In FIG. 7, loss L3 of a high-frequency wave exhibited when a path from the amplifier 201 to the termination circuit 301A is considered and loss L4 exhibited when a path from the amplifier 201, to the termination circuit 301A, to the transmission line 401, and then to the termination circuit 501 is considered are represented.

The loss L3 represents that a fifth harmonic has been attenuated to a large degree by the termination circuit 301A. The loss L4 represents that a third harmonic has been attenuated to a large degree by the termination circuit 501.

Figure 8:
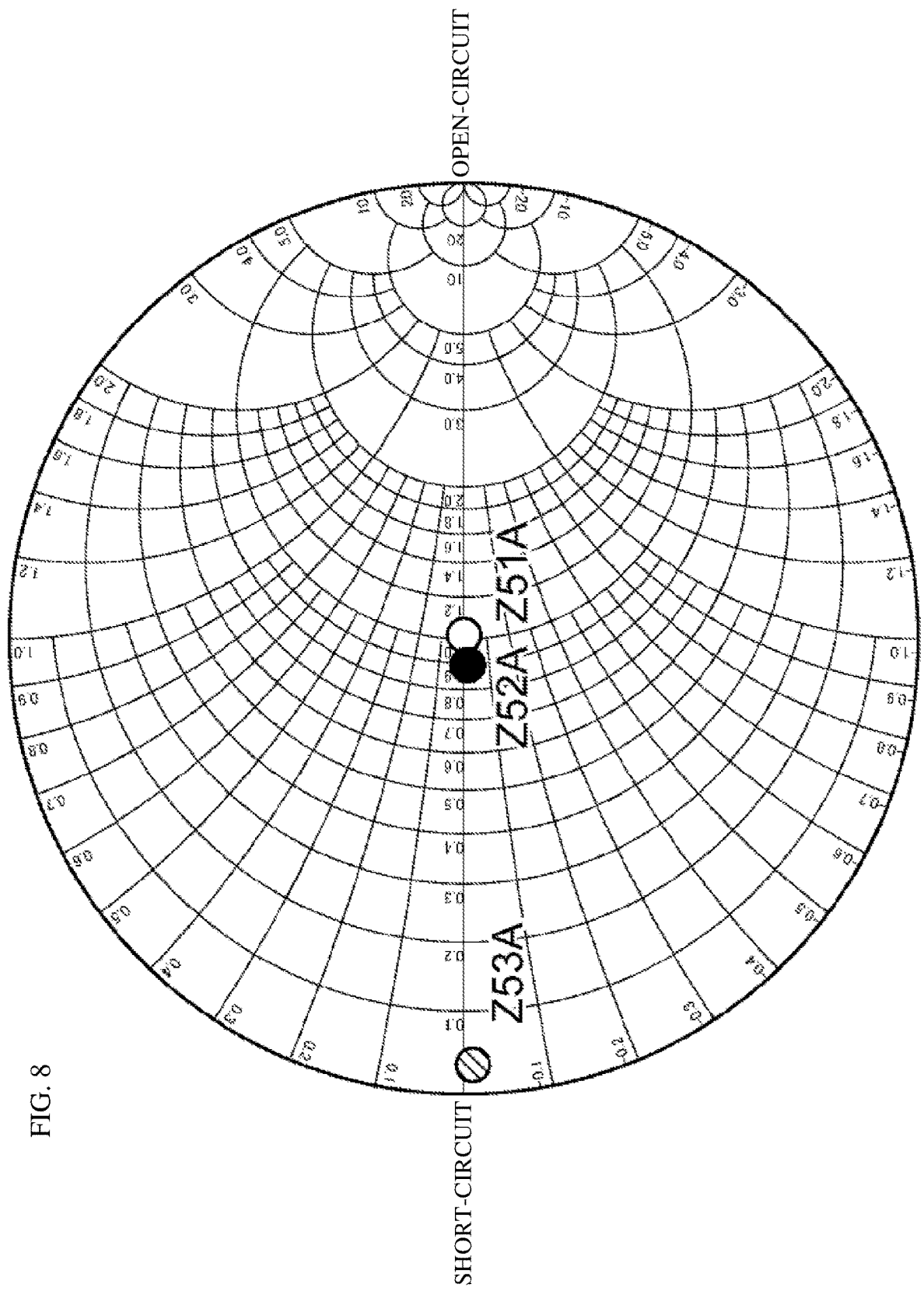
FIG. 8 is a Smith chart illustrating an example of impedance in the power amplifier circuit according to the second embodiment.

Attenuations of a third harmonic and a fifth harmonic of the amplified signal RF3 will be described from the viewpoint of impedance with reference to FIGS. 8 and 9. In a Smith chart in FIG. 8, at a frequency of a fifth harmonic, an impedance Z51A as seen from the power combiner 601 looking into the output terminal 12, an impedance Z52A as seen from the other end of the transmission line 401 looking into the output terminal 12, and an impedance Z53A as seen from the output terminal 2011 looking into the output terminal 12 are represented.

A transition from the impedance Z51A to the impedance Z53A will be described. The impedance Z51A is located at the center of the chart because impedance matching has been achieved between the power combiner 601 and the output terminal 12. The impedance Z52A is affected by the power combiner 601 and the termination circuit 501 that terminates a third harmonic and moves slightly from the center to the left side, that is, to a short-circuit side.

A value of the impedance Z53A changes from the impedance Z52A due to a series connection of the transmission line 401 and a parallel connection of the termination circuit 301A.

When the transmission line 401 is connected in series, the location of the impedance changes clockwise and moves to an inductive region, which is the upper half of the chart.

Subsequently, when the termination circuit 301A is connected in parallel, that is, when the LC series resonant circuit including the capacitor 3011A and the inductor 3012 is connected in parallel, the location of the impedance changes clockwise and moves to a capacitive region, which is the lower half of the chart. The impedance Z53A is located near a short-circuit impedance away from the center of the chart because the termination circuit 301A resonates at the frequency of the fifth harmonic.

As in the power amplifier circuit 10 according to the first embodiment, the fifth harmonic of the amplified signal RF3 is terminated by the termination circuit 301A. The termination circuit 301A can attenuate the fifth harmonic to a larger degree than the termination circuit 301, and thus the impedance Z53A on the chart is located farther away from the center than the impedance Z53. Since a reflection coefficient is high when a distance away from the center is large, the degree of attenuation is high. Thus, the fifth harmonic is attenuated to a large degree by the termination circuit 301A as illustrated in FIG. 7.

Figure 9:
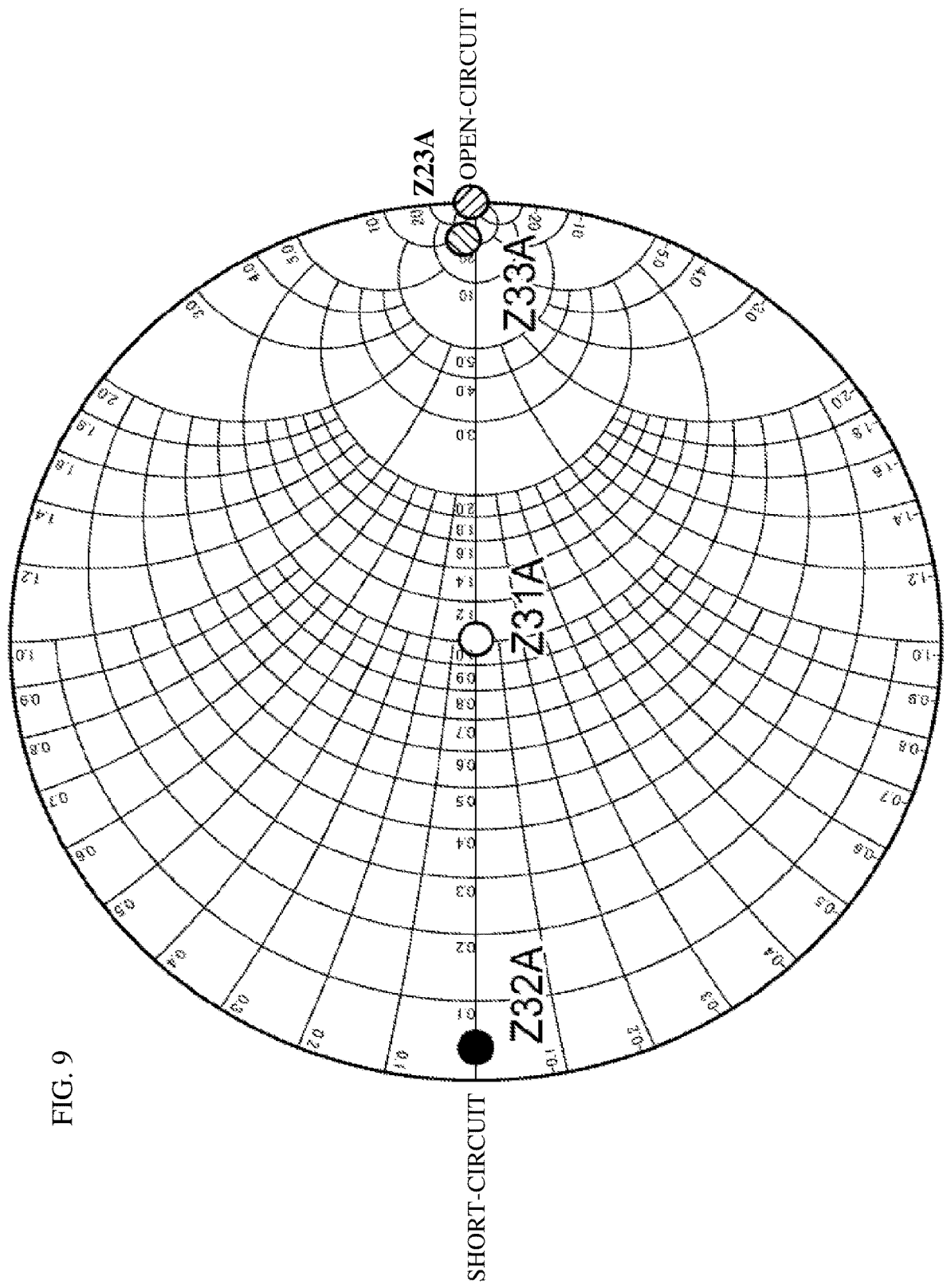
FIG. 9 is a Smith chart illustrating an example of impedance in the power amplifier circuit according to the second embodiment.

In a Smith chart in FIG. 9, at a frequency of a third harmonic, an impedance Z31A as seen from the power combiner 601 looking into the output terminal 12, an impedance Z32A as seen from the other end of the transmission line 401 looking into the output terminal 12, and an impedance Z33A as seen from the output terminal 2011 looking into the output terminal 12 are represented. Furthermore, an impedance Z23A as seen from the output terminal 2011 at a frequency of a second harmonic is represented.

A transition from the impedance Z31A to the impedance Z33A will be described. The impedance Z31A is located at the center of the chart because impedance matching has been achieved between the power combiner 601 and the output terminal 12. The impedance Z32A is located near a short-circuit (zero) impedance away from the center of the chart because the termination circuit 501 resonates at the frequency of the third harmonic. As in the first embodiment, the third harmonic of the amplified signal RF3 is attenuated.

A value of the impedance Z33A changes from the impedance Z32A due to a series connection of the transmission line 401 and a parallel connection of the termination circuit 301A.

When the transmission line 401 is connected in series, the location of the impedance changes clockwise and moves to an inductive region, which is the upper half of the chart.

Subsequently, when the termination circuit 301A is connected in parallel, that is, when the LC series resonant circuit including the capacitor 3011A and the inductor 3012 is connected in parallel, the impedance Z33A moves to a location closer to an open-circuit (infinite) side.

The impedance is caused to move clockwise by the capacitor 3011A. The impedance is caused to move counterclockwise by the inductor 3012. Thus, when the capacitance of the capacitor 3011A is increased and the inductance of the inductor 3012 is reduced, the impedance Z33A can be caused to be located near an open-circuit impedance.

The capacitance of the capacitor 3011A and the inductance of the inductor 3012 satisfy a condition for terminating a fifth harmonic of the amplified signal RF3.

As in the first embodiment, the impedance Z23A is located near the open-circuit impedance on the chart in FIG. 9.

In the power amplifier circuit 10A, when the second harmonic impedance Z23A is located near the open-circuit impedance and the third harmonic impedance Z33A is caused to be located near the open-circuit impedance, the amplifier 201 and the amplifier 202 achieve class E operation. Thus, the efficiency of the power amplifier circuit 10A is improved.

If a condition for terminating a fifth harmonic of the amplified signal RF3 is satisfied, the capacitance of the capacitor 3011A and the inductance of the inductor 3012 may cause the impedance Z33A to be a value close to the short-circuit impedance.

When the impedance Z33A is caused to be a value close to the short-circuit impedance, the amplifier 201 and the amplifier 202 achieve inverse class F operation. When the amplifier 201 and the amplifier 202 are caused to operate in inverse class F, the efficiency of the power amplifier circuit 10A is also improved.

Although an impedance as seen from the output terminal 2011 has been described, the same holds true for an impedance as seen from the output terminal 2021.

Figure 10:
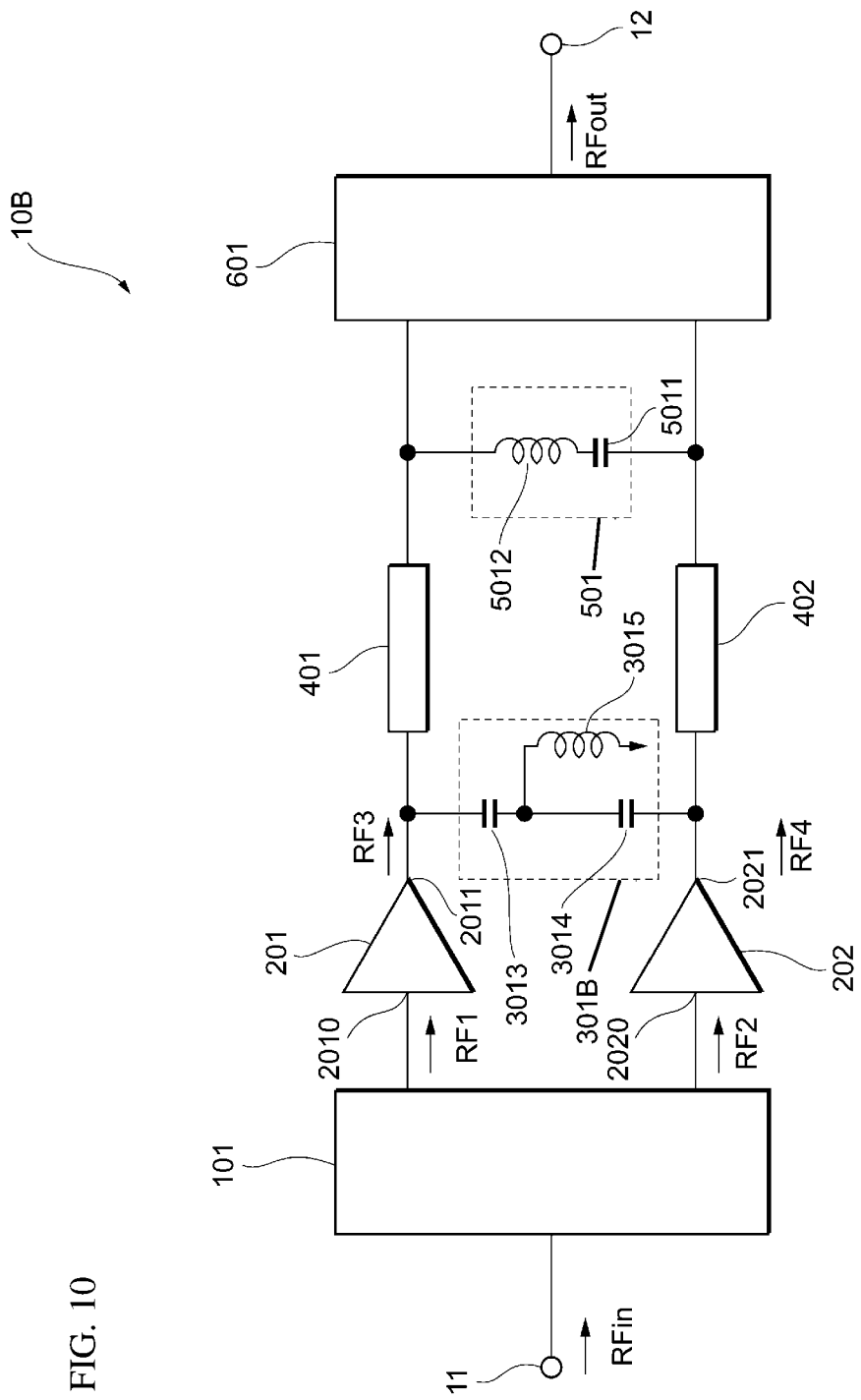
FIG. 10 is a circuit diagram of a power amplifier circuit according to a third embodiment.

A power amplifier circuit 10B according to a third embodiment will be described. As illustrated in FIG. 10, the power amplifier circuit 10B according to the third embodiment differs from the power amplifier circuit 10A in that the power amplifier circuit 10B includes a termination circuit 301B.

The termination circuit 301B includes capacitors 3013 and 3014, and an inductor 3015. One end of the capacitor 3013 is connected to the output terminal 2011. The other end of the capacitor 3013 is connected to one end of the capacitor 3014. The other end of the capacitor 3014 is connected to the output terminal 2021. One end of the inductor 3015 is connected to a connection point between the capacitor 3013 and the capacitor 3014. The other end of the inductor 3015 is grounded.

The termination circuit 301B attenuates a fifth harmonic of the amplified signal RF3 by using the capacitor 3013 and the inductor 3015. The termination circuit 301B attenuates a fifth harmonic of the amplified signal RF4 by using the capacitor 3014 and the inductor 3015.

The power amplifier circuit 10B causes a fifth harmonic of the amplified signal RF3 and a fifth harmonic of the amplified signal RF4 to be terminated individually, thereby enabling the fifth harmonics to be attenuated even if a phase difference between the amplified signal RF3 and the amplified signal RF4 is not about 180°.

Figure 11:
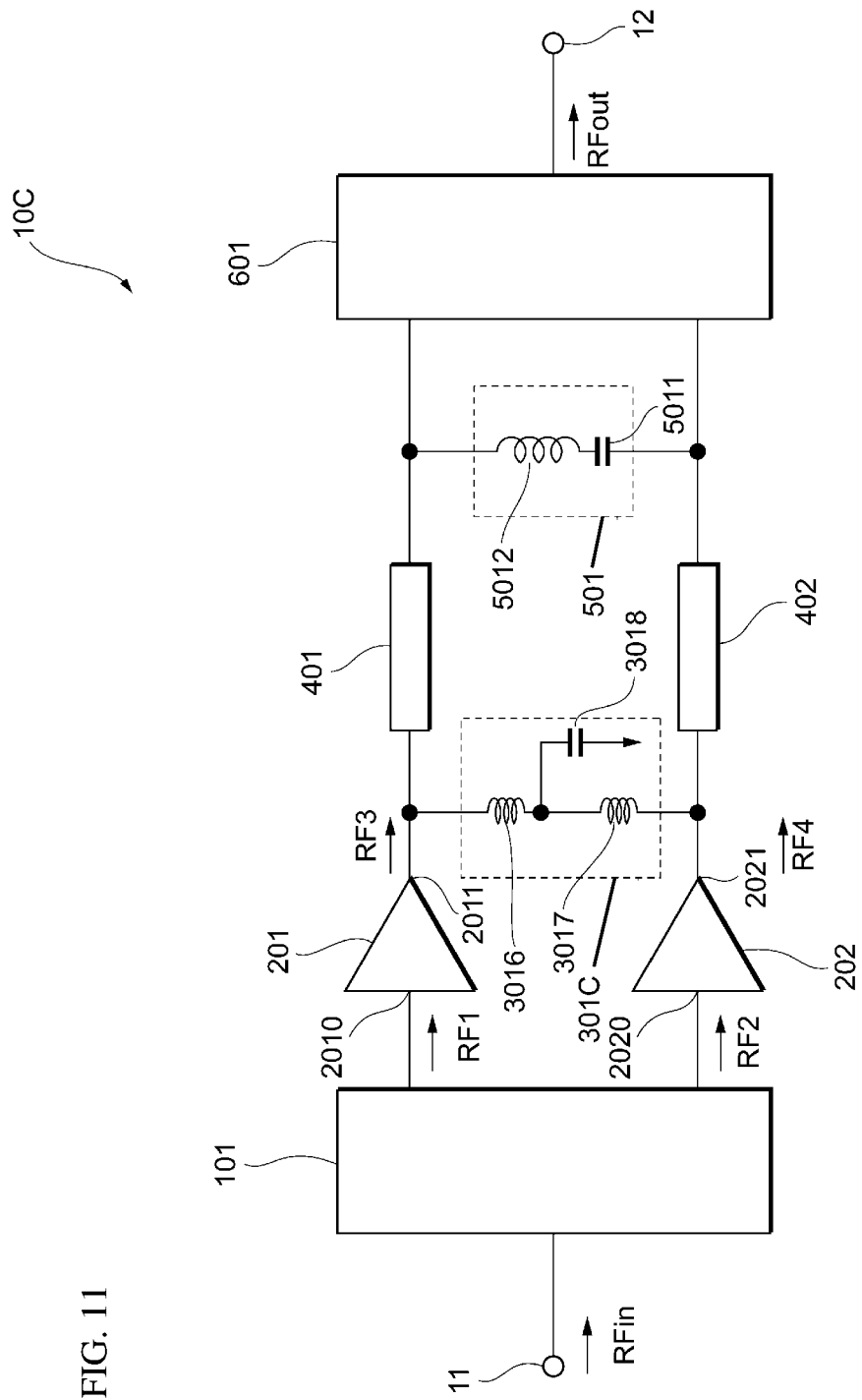
FIG. 11 is a circuit diagram of a power amplifier circuit according to a fourth embodiment.

A power amplifier circuit 10C according to a fourth embodiment will be described. As illustrated in FIG. 11, the power amplifier circuit 10C differs from the power amplifier circuit 10A in that the power amplifier circuit 10C includes a termination circuit 301C. The termination circuit 301C includes inductors 3016 and 3017, and a capacitor 3018.

One end of the inductor 3016 is connected to the output terminal 2011. The other end of the inductor 3016 is connected to one end of the inductor 3017. The other end of the inductor 3017 is connected to the output terminal 2021. One end of the capacitor 3018 is connected to a connection point between the inductor 3016 and the inductor 3017. The other end of the capacitor 3018 is grounded.

As in the power amplifier circuit 10B, the power amplifier circuit 10C can cause a fifth harmonic of the amplified signal RF3 and a fifth harmonic of the amplified signal RF4 to be terminated individually. Thus, the fifth harmonics can be attenuated even if a phase difference between the amplified signal RF3 and the amplified signal RF4 is not about 180°.

Furthermore, the power amplifier circuit 10C enables the one end of the capacitor 3018 to supply a power supply voltage to the amplifier 201 and the amplifier 202 through the connection point between the inductor 3016 and the inductor 3017. A power supply voltage is supplied by using the termination circuit 301C, thereby enabling the miniaturization of the circuit.

Figure 12:
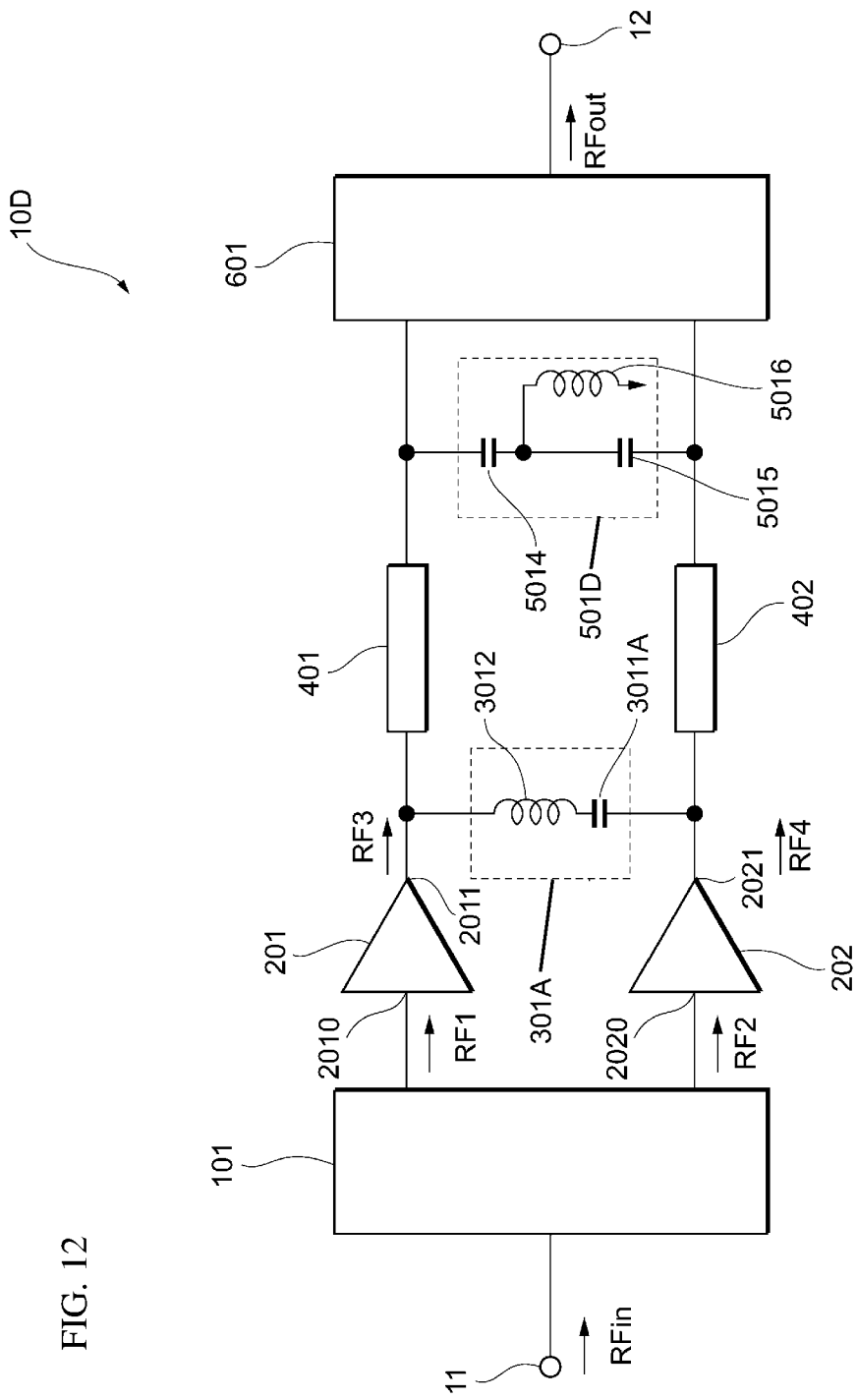
FIG. 12 is a circuit diagram of a power amplifier circuit according to a fifth embodiment.

A power amplifier circuit 10D according to a fifth embodiment will be described. As illustrated in FIG. 12, the power amplifier circuit 10D differs from the power amplifier circuit 10A in that the power amplifier circuit 10D includes a termination circuit 501D. The termination circuit 501D includes capacitors 5014 and 5015, and an inductor 5016.

One end of the capacitor 5014 is connected to the other end of the transmission line 401. The other end of the capacitor 5014 is connected to one end of the capacitor 5015. The other end of the capacitor 5015 is connected to the other end of the transmission line 402. One end of the inductor 5016 is connected to a connection point between the capacitor 5014 and the capacitor 5015. The other end of the inductor 5016 is grounded.

The termination circuit 501D attenuates a third harmonic of the amplified signal RF3 by using the capacitor 5014 and the inductor 5016. The termination circuit 501D attenuates a third harmonic of the amplified signal RF4 by using the capacitor 5015 and the inductor 5016.

The power amplifier circuit 10D causes a third harmonic of the amplified signal RF3 and a third harmonic of the amplified signal RF4 to be terminated individually, thereby enabling the third harmonics to be attenuated even if a phase difference between the amplified signal RF3 and the amplified signal RF4 is not about 180°.

Figure 13:
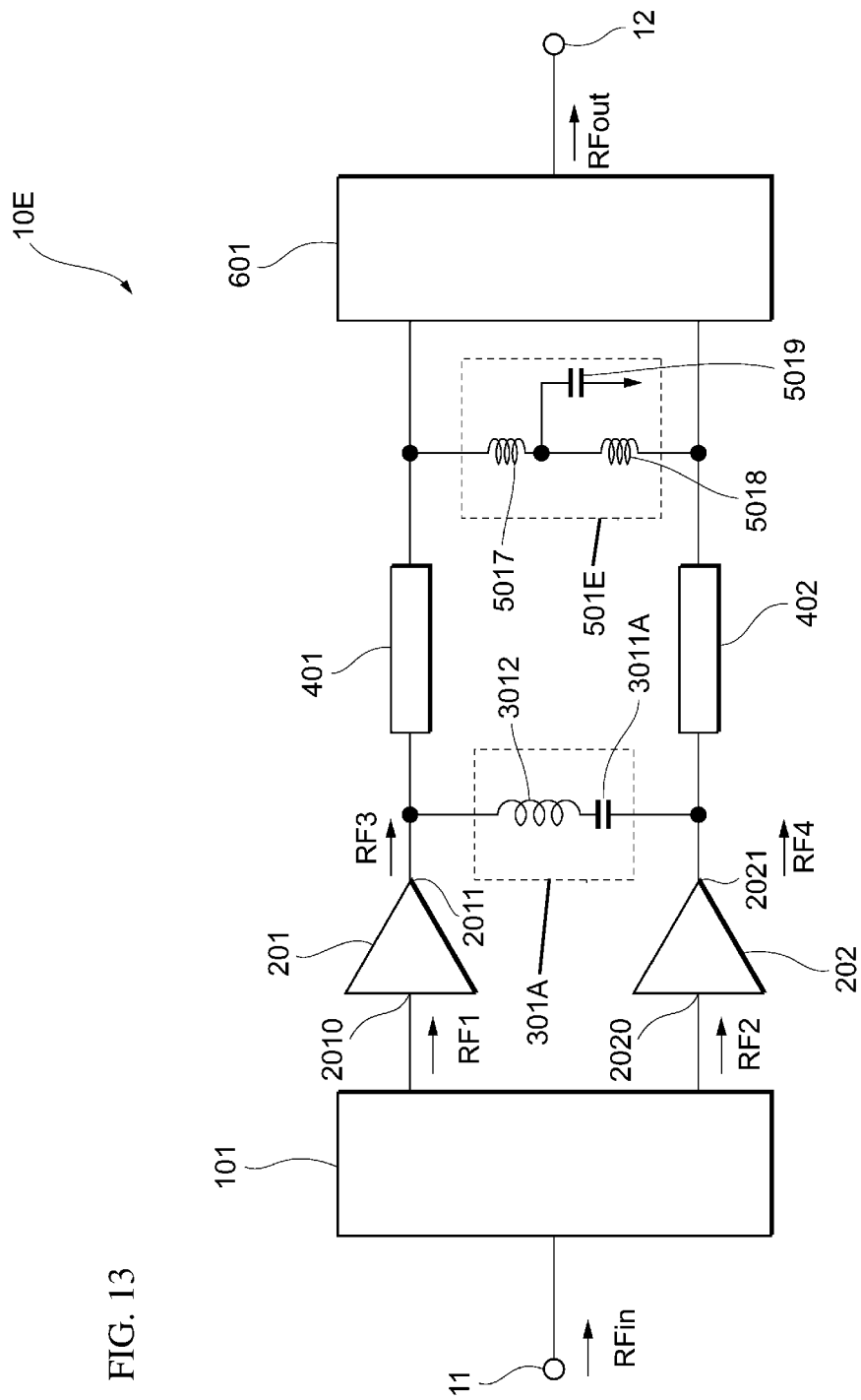
FIG. 13 is a circuit diagram of a power amplifier circuit according to a sixth embodiment.

A power amplifier circuit 10E according to a sixth embodiment will be described. As illustrated in FIG. 13, the power amplifier circuit 10E differs from the power amplifier circuit 10A in that the power amplifier circuit 10E includes a termination circuit 501E. The termination circuit 501E includes inductors 5017 and 5018, and a capacitor 5019.

One end of the inductor 5017 is connected to the other end of the transmission line 401. The other end of the inductor 5017 is connected to one end of the inductor 5018. The other end of the inductor 5018 is connected to the other end of the transmission line 402. One end of the capacitor 5019 is connected to a connection point between the inductor 5017 and the inductor 5018. The other end of the capacitor 5019 is grounded.

As in the power amplifier circuit 10D, the power amplifier circuit 10E can cause a third harmonic of the amplified signal RF3 and a third harmonic of the amplified signal RF4 to be terminated individually. Thus, the third harmonics can be attenuated even if a phase difference between the amplified signal RF3 and the amplified signal RF4 is not about 180°.

Figure 14:
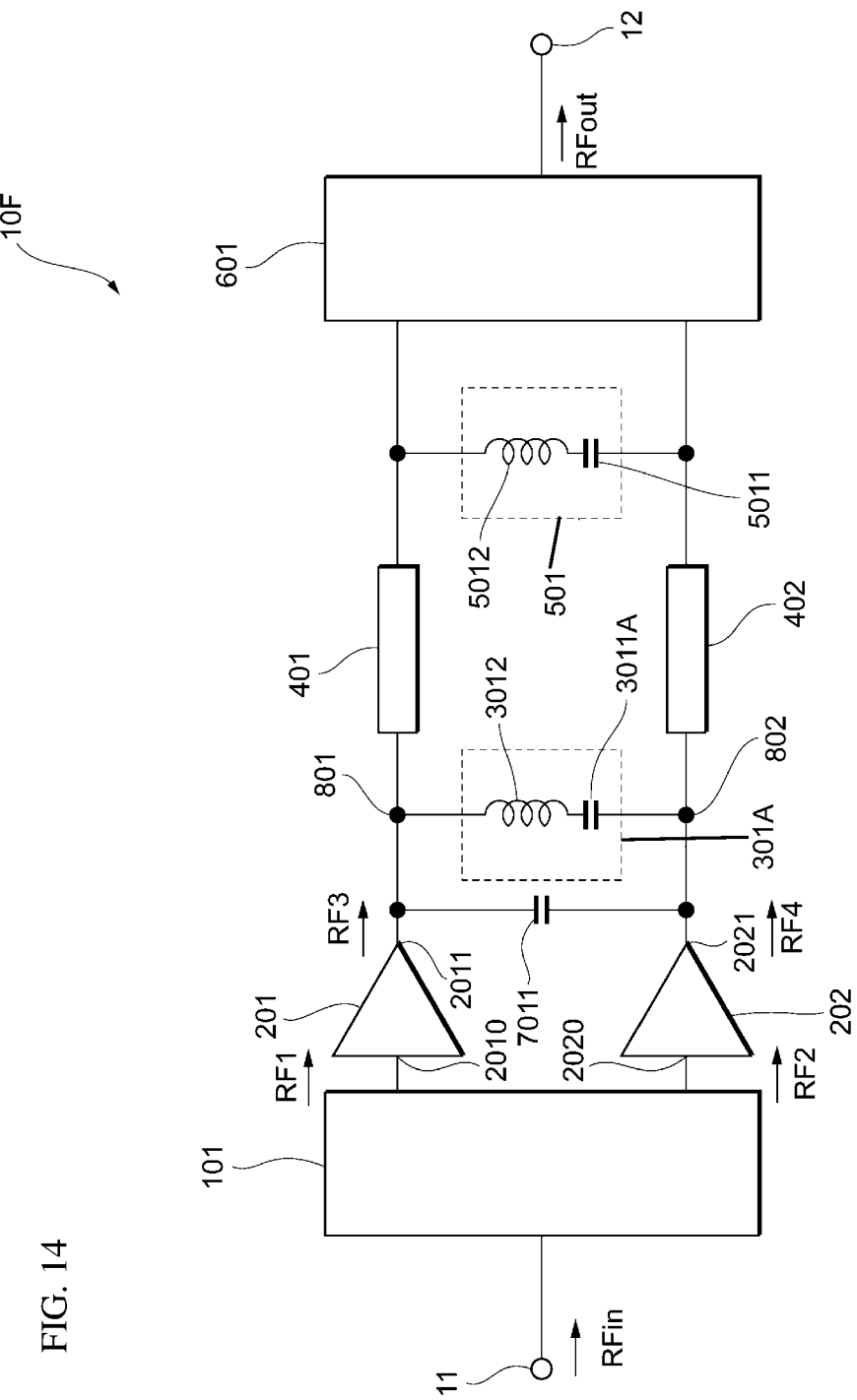
FIG. 14 is a circuit diagram of a power amplifier circuit according to a seventh embodiment.

A power amplifier circuit 10F according to a seventh embodiment will be described. In the seventh embodiment and an eighth embodiment to be described, the amplifier 201 and the amplifier 202 operate in class E. As illustrated in FIG. 14, the power amplifier circuit 10F differs from the power amplifier circuit 10A in that the power amplifier circuit 10F includes a capacitor 7011.

The capacitor 7011 is connected between a connection point 801 between the amplifier 201 and the termination circuit 301A and a connection point 802 between the amplifier 202 and the termination circuit 301A. The capacitor 7011 adjusts a third or higher odd harmonic impedance as seen from the output terminal 2011 and a third or higher odd harmonic impedance as seen from the output terminal 2021.

The capacitor 7011 is connected in parallel. Thus, at a frequency of a third harmonic of the amplified signal RF3, an impedance as seen from the amplifier 201 can be caused to move clockwise further from the impedance Z33A in FIG. 9 by the capacitor 7011.

In the termination circuit 301A, circuit component values are adjusted so that the impedance Z33A is brought close to the open-circuit side while terminating a fifth harmonic. The case is also conceivable where it is difficult to satisfy a condition for terminating a fifth harmonic and a condition for bringing the impedance Z33A close to the open-circuit side. Even in such a case, when the capacitor 7011 is provided, the location of an impedance can be changed to a location on the open-circuit side, and thus the location of the impedance Z33A can be adjusted to be located closer to the open-circuit side.

When the impedance Z33A is further adjusted by the capacitor 7011, the operation of each of the amplifier 201 and the amplifier 202 can be brought closer to ideal class E operation. When the operation of each of the amplifier 201 and the amplifier 202 is improved, the efficiency of the power amplifier circuit 10F is improved.

Figure 15:
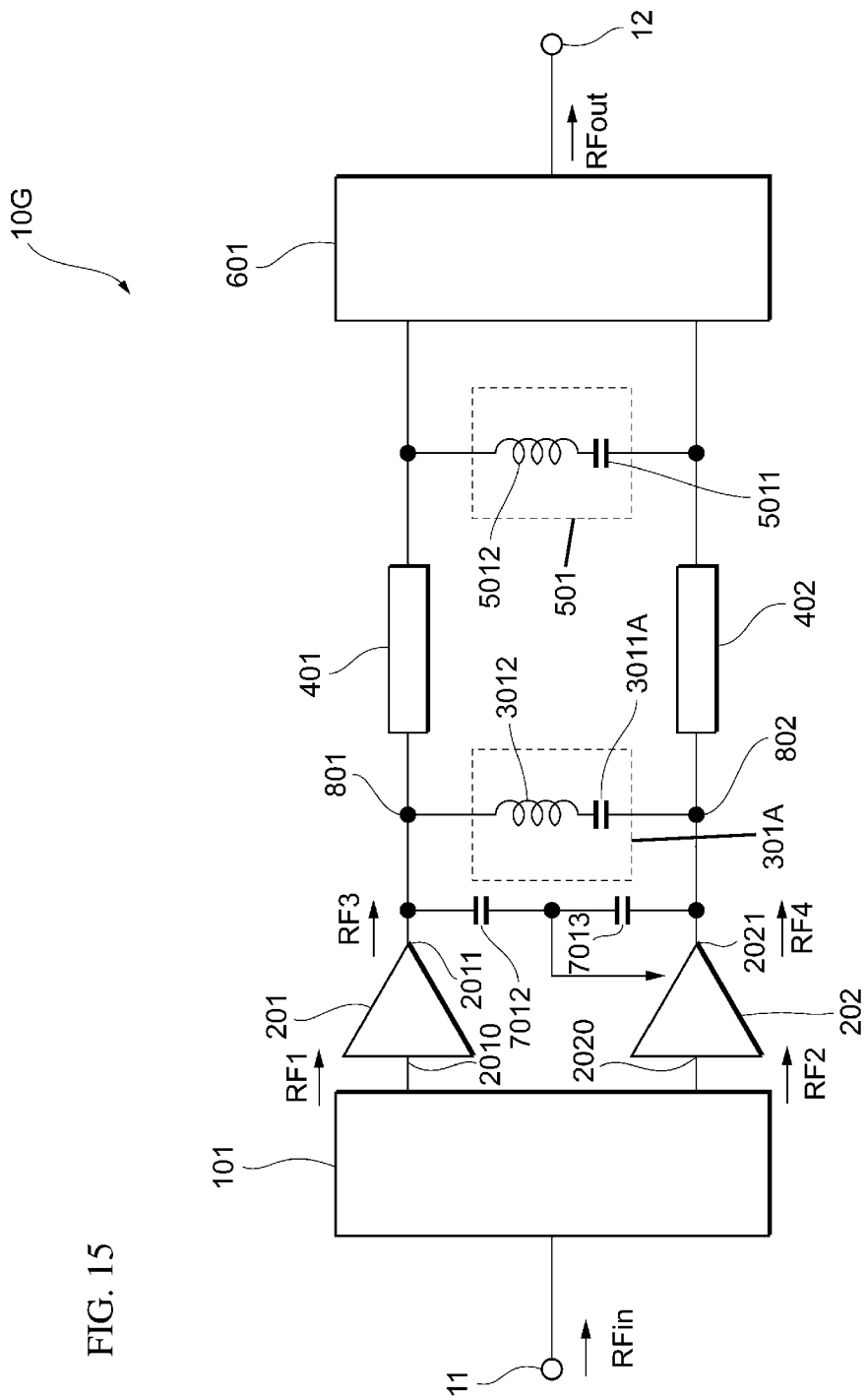
FIG. 15 is a circuit diagram of a power amplifier circuit according to an eighth embodiment.

A power amplifier circuit 10G according to an eighth embodiment will be described. As illustrated in FIG. 15, the power amplifier circuit 10G differs from the power amplifier circuit 10A in that the power amplifier circuit 10G includes a capacitor 7012 and a capacitor 7013.

One end of the capacitor 7012 is connected between the amplifier 201 and the connection point 801. The other end of the capacitor 7012 is grounded. One end of the capacitor 7013 is connected between the amplifier 202 and the connection point 802. The other end of the capacitor 7013 is connected to the other end of the capacitor 7012 and a ground.

As in the power amplifier circuit 10F, in the power amplifier circuit 10G, efficiency can be improved even if a phase difference between the amplified signal RF3 and the amplified signal RF4 deviates from about 180°.

Figure 16:
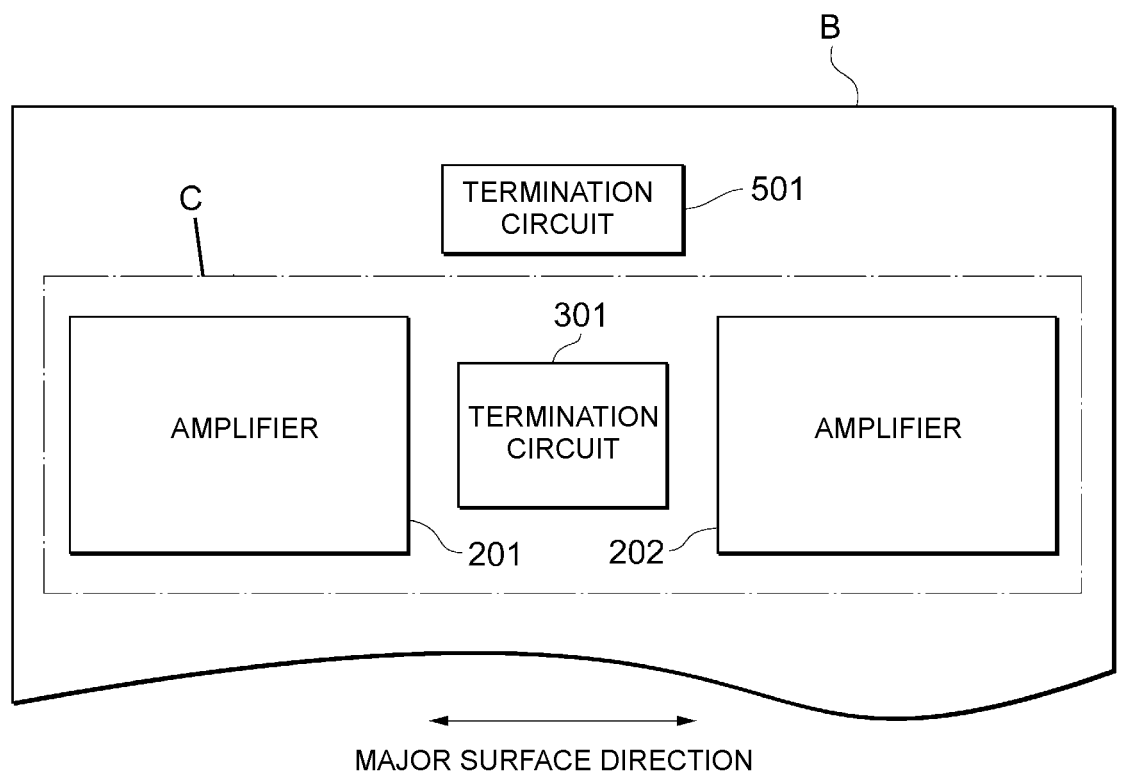
FIG. 16 is a schematic diagram of a layout of circuits in the power amplifier circuit.

A ninth embodiment will be described. FIG. 16 is a schematic diagram of a layout of the amplifiers 201 and 202, the termination circuit 301, and the termination circuit 501 in the power amplifier circuit 10. The power amplifier circuit 10 is provided on a substrate B. The amplifiers 201 and 202, and the termination circuit 301 are provided on a chip C disposed on the substrate B.

At this time, the termination circuit 301 is disposed immediately next to the amplifier 201 and the amplifier 202. This enables a fifth harmonic to be attenuated even if a path from the amplifier 201 to the power combiner 601 and a path from the amplifier 202 to the power combiner 601 are asymmetric.

Furthermore, the termination circuit 301 and the termination circuit 501 are disposed between the amplifier 201 and the amplifier 202. In other words, the amplifier 201 and the amplifier 202 are provided on the chip C so that the termination circuit 301 is interposed therebetween in a direction along a major surface of the chip C represented as a major surface direction in FIG. 16. Thus, the amplifier 201 and the amplifier 202 are disposed away from each other.

When the output of the amplifier 201 and the output of the amplifier 202 increase, the amplifier 201 and the amplifier 202 generate heat. When the amplifier 201 and the amplifier 202 are disposed adjacent to each other on the chip C, heat interference occurs. When heat interference occurs, the operation of the amplifier 201 and the operation of the amplifier 202 become unstable. When the amplifier 201 and the amplifier 202 are disposed away from each other, heat interference between the amplifier 201 and the amplifier 202 can be suppressed.

As termination circuits, the termination circuit 301, 301A, 301B, or 301C and the termination circuit 501, 501D, or 501E that are appropriately combined can be used.

In the case where the amplifier 201 and the amplifier 202 are caused to operate in class E, the termination circuit 301, 301A, 301B, or 301C has to be disposed closer to the amplifier 201 and the amplifier 202 than the termination circuit 501, 501D, or 501E. This is because, if the termination circuit 501, 501D, or 501E is located closer to the amplifier 201 and the amplifier 202 than the termination circuit 301, 301A, 301B, or 301C, third harmonic impedances as seen from the amplifier 201 and the amplifier 202 reach respective short-circuit impedances and class E operation is not achieved.

The exemplary embodiments of the present disclosure have been described above. The power amplifier circuit 10 includes the power splitter 101 configured to receive the input signal RFin through the input terminal 11 and output the signal RF1 and the signal RF2 that differ in phase from each other; the amplifier 201 having the input terminal 2010 and the output terminal 2011 and configured to output, from the output terminal 2011, the amplified signal RF3 obtained by amplifying the signal RF1 input from the input terminal 2010; and the amplifier 202 having the input terminal 2020 and the output terminal 2021 and configured to output, from the output terminal 2021, the amplified signal RF4 obtained by amplifying the signal RF2 input from the input terminal 2020. The power amplifier circuit 10 further includes the termination circuit 301 including the capacitor 3011 that is connected between the output terminal 2011 and the output terminal 2021 and that attenuates fifth or higher odd harmonics of the amplified signal RF3 and the amplified signal RF4; the transmission line 401 having one end connected to the output terminal 2011 of the amplifier 201; the transmission line 402 having one end connected to the output terminal 2021 of the amplifier 202; the termination circuit 501 including the capacitor 5011 and the inductor 5012 that are connected between the other end of the transmission line 401 and the other end of the transmission line 402 and that attenuate odd harmonics included in the amplified signal RF3 and the amplified signal RF4; and the power combiner 601 connected to the other end of the transmission line 401 and the other end of the transmission line 402 and configured to output the signal RFout obtained by combining the amplified signal RF3 and the amplified signal RF4. In the power amplifier circuit 10, a capacitance value of the capacitor 3011 of the termination circuit 301 is lower than a capacitance value of the capacitor 5011 of the termination circuit 501. An odd harmonic of the signal RFout has been attenuated so that a ratio of the odd harmonic to a fundamental in the signal RFout is smaller than a ratio of the odd harmonic to the fundamental in the input signal RFin. In the signal RFout, the odd harmonic of the input signal RFin has been attenuated in comparison with the fundamental of the input signal RFin.

In the power amplifier circuit 10, the termination circuit 301 and the termination circuit 501 can attenuate third and higher odd harmonics. Furthermore, when a value of the capacitor 3011 used for attenuating a fifth harmonic is appropriately changed, operating classes of the amplifier 201 and the amplifier 202 can be changed while attenuating a fifth harmonic. When the operating classes of the amplifier 201 and the amplifier 202 are brought close to an ideal operating condition, the efficiency of the power amplifier circuit 10 can be improved.

Furthermore, in the power amplifier circuit 10A, the termination circuit 301A includes the inductor 3012. This configuration causes the termination circuit 301A to have an impedance that attenuates a fifth harmonic to a large degree.

Furthermore, in the power amplifier circuit 10A, the inductor 3012 has one end connected to the output terminal 2011 and the other end connected to one end of the capacitor 3011A, and the other end of the capacitor 3011A is connected to the output terminal 2021. This configuration can cause the termination circuit 301A to serve as an LC series resonant circuit to attenuate a fifth harmonic.

Furthermore, in the power amplifier circuit 10B, the termination circuit 301B includes the capacitor 3013 and the capacitor 3014, the capacitor 3013 has one end connected to the output terminal 2011 and the other end connected to one end of the capacitor 3014, the other end of the capacitor 3014 is connected to the output terminal 2021, and the inductor 3015 has one end connected to a connection point between the capacitor 3013 and the capacitor 3014 and the other end grounded.

This configuration can attenuate a fifth harmonic even if a phase difference between the amplified signal RF3 and the amplified signal RF4 deviates from about 180°.

Furthermore, in the power amplifier circuit 10C, the termination circuit 301C includes the inductor 3016 and the inductor 3017, the inductor 3016 has one end connected to the output terminal 2011 and the other end connected to one end of the inductor 3017, the other end of the inductor 3017 is connected to the output terminal 2021, and the capacitor 3018 has one end connected to a connection point between the inductor 3016 and the inductor 3017 and the other end grounded.

This configuration can also attenuate a fifth harmonic even if a phase difference between the amplified signal RF3 and the amplified signal RF4 deviates from about 180°.

Furthermore, in the power amplifier circuit 10D, the termination circuit 501D includes the capacitor 5014 and the capacitor 5015, the capacitor 5014 has one end connected to the other end of the transmission line 401 and the other end connected to one end of the capacitor 5015, the other end of the capacitor 5015 is connected to the other end of the transmission line 402, and the inductor 5016 has one end connected to a connection point between the capacitor 5014 and the capacitor 5015 and the other end grounded.

This configuration can attenuate a third harmonic even if a phase difference between the amplified signal RF3 and the amplified signal RF4 deviates from about 180°.

Furthermore, in the power amplifier circuit 10E, the termination circuit 501E includes the inductor 5017 and the inductor 5018, the inductor 5017 has one end connected to the other end of the transmission line 401 and the other end connected to one end of the inductor 5018, the other end of the inductor 5018 is connected to the other end of the transmission line 402, and the capacitor 5019 has one end connected to a connection point between the inductor 5017 and the inductor 5018 and the other end grounded.

This configuration can also attenuate a third harmonic even if a phase difference between the amplified signal RF3 and the amplified signal RF4 deviates from about 180°.

Furthermore, the power amplifier circuit 10F includes the capacitor 7011 connected between the connection point 801 between the amplifier 201 and the termination circuit 301A and the connection point 802 between the amplifier 202 and the termination circuit 301A.

This configuration can bring the operation of each of the amplifier 201 and the amplifier 202 closer to ideal class E operation and thus can improve efficiency.

Furthermore, the power amplifier circuit 10G includes the capacitor 7012 connected between the connection point 801 and the connection point 802 and further includes the capacitor 7013 connected between the connection point 801 and the connection point 802, the capacitor 7012 connected between the connection point 801 and the connection point 802 has one end connected between the amplifier 201 and the connection point 801 and the other end grounded, and the capacitor 7013 connected between the connection point 801 and the connection point 802 has one end connected between the amplifier 202 and the connection point 802 and the other end connected to the other end of the capacitor 7012 connected between the connection point 801 and the connection point 802 and a ground.

This configuration can bring the operation of each of the amplifier 201 and the amplifier 202 closer to ideal class E operation even if a phase difference between the amplified signal RF3 and the amplified signal RF4 deviates from about 180° and can improve efficiency.

Furthermore, in the power amplifier circuits 10, 10A, 10B, 10C, 10D, 10E, 10F, and 10G, the amplifier 201, the amplifier 202, and the termination circuit 301, 301A, 301B, or 301C may be provided on the same chip.

This configuration can attenuate a fifth harmonic even if a path from the amplifier 201 to the power combiner 601 and a path from the amplifier 202 to the power combiner 601 are asymmetric.

Furthermore, in the power amplifier circuits 10, 10A, 10B, 10C, 10D, 10E, 10F, and 10G, the amplifier 201 and the amplifier 202 may be provided on the chip C so that the termination circuit 301, 301A, 301B, or 301C is interposed therebetween in a direction along a major surface of the chip C.

This configuration can suppress heat interference between the amplifier 201 and the amplifier 202.

The power amplifier circuit 10 adjusts a third harmonic impedance as seen from the output terminal 2011 and a third harmonic impedance as seen from the output terminal 2021 to respective predetermined values so that the third harmonic impedance as seen from the output terminal 2011 gets close to a short-circuit impedance and so that the third harmonic impedance as seen from the output terminal 2021 gets close to a short-circuit impedance.

This can cause the amplifier 201 and the amplifier 202 to operate in inverse class F. When the amplifier 201 and the amplifier 202 are caused to operate in inverse class F, the efficiency of the power amplifier circuit 10 can be improved.

In the power amplifier circuit 10A, the termination circuit 301A adjusts a third harmonic impedance as seen from the output terminal 2011 and a third harmonic impedance as seen from the output terminal 2021 to respective predetermined values so that the third harmonic impedance as seen from the output terminal 2011 gets close to an open-circuit impedance and so that the third harmonic impedance as seen from the output terminal 2021 gets close to an open-circuit impedance.

This can cause the amplifier 201 and the amplifier 202 to operate in class E. When the amplifier 201 and the amplifier 202 are caused to operate in class E, the efficiency of the power amplifier circuit 10A can be improved.

The above-described embodiments are intended to facilitate understanding of the present disclosure but are not intended for a limited interpretation of the present disclosure. The present disclosure can be changed or improved without necessarily departing from the gist thereof and encompasses equivalents thereof. That is, appropriate design changes made to the embodiments by those skilled in the art are also encompassed in the scope of the present disclosure as long as the changes have features of the present disclosure. For example, the elements included in the embodiments, and the arrangement, materials, conditions, shapes, sizes, and so forth of the elements are not limited to those exemplified herein and can be appropriately changed. Furthermore, the embodiments are illustrative, and it goes without necessarily saying that configurations described in different embodiments can be partially replaced or combined. Such replacement and combination are also encompassed in the scope of the present disclosure as long as they have features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
    a power splitter configured to receive an input signal through an input terminal, and to output a first signal and a second signal, the first signal and second signal having different phases;
    a first amplifier having a first input terminal and a first output terminal, and configured to output a first amplified signal from the first output terminal, the first amplified signal being obtained by amplifying the first signal input;
    a second amplifier having a second input terminal and a second output terminal, and configured to output a second amplified signal from the second output terminal, the second amplified signal being obtained by amplifying the second signal;
    a first termination circuit comprising a capacitor connected between the first output terminal and the second output terminal;
    a first transmission line having a first end connected to the first output terminal;
    a second transmission line having a first end connected to the second output terminal;
    a second termination circuit comprising a capacitor and an inductor that are connected between a second end of the first transmission line and a second end of the second transmission line; and
    a power combiner connected to the second end of the first transmission line and to the second end of the second transmission line, and configured to output an output signal obtained by combining the first amplified signal and the second amplified signal, wherein a capacitance value of the capacitor of the first termination circuit is lower than a capacitance value of the capacitor of the second termination circuit, and wherein an odd harmonic of the output signal is attenuated such that a ratio of the odd harmonic to a fundamental frequency in the output signal is less than a ratio of the odd harmonic to the fundamental frequency in the input signal.

2. The power amplifier circuit according to claim 1, wherein the first termination circuit further comprises an inductor.

3. The power amplifier circuit according to claim 2,
wherein the inductor of the first termination circuit has a first end connected to the first output terminal and a second end connected to a first end of the capacitor of the first termination circuit, and
wherein a second end of the capacitor of the first termination circuit is connected to the second output terminal.

4. The power amplifier circuit according to claim 2,
wherein the capacitor of the first termination circuit is a first capacitor,
wherein the first termination circuit further comprises a second capacitor,
wherein the first capacitor of the first termination circuit has a first end connected to the first output terminal and a second end connected to a first end of the second capacitor of the first termination circuit,
wherein a second end of the second capacitor of the first termination circuit is connected to the second output terminal, and
wherein the inductor of the first termination circuit has a first end connected to a node between the first capacitor of the first termination circuit and the second capacitor of the first termination circuit, and a second end connected to ground.

5. The power amplifier circuit according to claim 2,
wherein the inductor of the first termination circuit is a first inductor,
wherein the first termination circuit further comprises a second inductor,
wherein the first inductor of the first termination circuit has a first end connected to the first output terminal and a second end connected to a first end of the second inductor of the first termination circuit,
wherein a second end of the second inductor of the first termination circuit is connected to the second output terminal, and
wherein the capacitor of the first termination circuit has a first end connected to a node between the first inductor of the first termination circuit and the second inductor of the first termination circuit, and a second end connected to ground.

6. The power amplifier circuit according to claim 1,
wherein the capacitor of the second termination circuit is a first capacitor,
wherein the second termination circuit further comprises a second capacitor,
wherein the first capacitor of the second termination circuit has a first end connected to the second end of the first transmission line and a second end connected to a first end of the second capacitor of the second termination circuit,
wherein a second end of the second capacitor of the second termination circuit is connected to the second end of the second transmission line, and
wherein the inductor of the second termination circuit has a first end connected to a node between the first capacitor of the second termination circuit and the second capacitor of the second termination circuit, and a second end connected to ground.

7. The power amplifier circuit according to claim 1,
wherein the inductor of the second termination circuit is a first inductor,
wherein the second termination circuit further comprises a second inductor,
wherein the first inductor of the second termination circuit has a first end connected to the second end of the first transmission line and a second end connected to a first end of the second inductor of the second termination circuit,
wherein a second end of the second inductor of the second termination circuit is connected to the second end of the second transmission line, and
wherein the capacitor of the second termination circuit has a first end connected to a node between the first inductor of the second termination circuit and the second inductor of the second termination circuit, and a second end connected to ground.

8. The power amplifier circuit according to claim 1, further comprising:
a parallel circuit comprising a parallel capacitor connected in parallel with the first termination circuit between the first output terminal and the second output terminal,
wherein the parallel capacitor is connected between the first and second amplifiers, and the first termination circuit.

9. The power amplifier circuit according to claim 8,
wherein the parallel capacitor is a first parallel capacitor,
wherein the parallel circuit further comprises a second parallel capacitor,
wherein the first parallel capacitor of the parallel circuit has a first end connected to the first output terminal and a second end connected to ground, and
wherein the second parallel capacitor of the parallel circuit has a first end connected to the second output terminal and a second end connected to ground.

10. The power amplifier circuit according to claim 1, wherein the first amplifier, the second amplifier, and the first termination circuit are physically arranged on a same chip.

11. The power amplifier circuit according to claim 10, wherein the first termination circuit is physically arranged along a major surface direction of the chip between the first amplifier and the second amplifier.

12. The power amplifier circuit according to claim 1, wherein the power splitter and the power combiner each comprise a transformer having a same configuration.

13. The power amplifier circuit according to claim 2,
wherein the capacitor of the second termination circuit is a first capacitor,
wherein the second termination circuit further comprises a second capacitor,
wherein the first capacitor of the second termination circuit has a first end connected to the second end of the first transmission line and a second end connected to a first end of the second capacitor of the second termination circuit, wherein a second end of the second capacitor of the second termination circuit is connected to the second end of the second transmission line, and wherein the inductor of the second termination circuit has a first end connected to a node between the first capacitor of the second termination circuit and the second capacitor of the second termination circuit, and a second end connected to ground.

14. The power amplifier circuit according to claim 2,
wherein the inductor of the second termination circuit is a first inductor,
wherein the second termination circuit further comprises a second inductor,
wherein the first inductor of the second termination circuit has a first end connected to the second end of the first transmission line and a second end connected to a first end of the second inductor of the second termination circuit,
wherein a second end of the second inductor of the second termination circuit is connected to the second end of the second transmission line, and
wherein the capacitor of the second termination circuit has a first end connected to a node between the first inductor of the second termination circuit and the second inductor of the second termination circuit, and a second end connected to ground.

15. The power amplifier circuit according to claim 2, further comprising:
a parallel circuit comprising a parallel capacitor connected in parallel with the first termination circuit between the first output terminal and the second output terminal,
wherein the parallel capacitor is connected between the first and second amplifiers, and the first termination circuit.

16. The power amplifier circuit according to claim 9,
wherein the parallel capacitor is a first parallel capacitor,
wherein the parallel circuit further comprises a second parallel capacitor,
wherein the first parallel capacitor of the parallel circuit has a first end connected to the first output terminal and a second end connected to ground, and
wherein the second parallel capacitor of the parallel circuit has a first end connected to the second output terminal and a second end connected to ground.

17. The power amplifier circuit according to claim 2, wherein the first amplifier, the second amplifier, and the first termination circuit are physically arranged on a same chip.

18. The power amplifier circuit according to claim 17, wherein the first termination circuit is physically arranged along a major surface direction of the chip between the first amplifier and the second amplifier.

19. The power amplifier circuit according to claim 3,
wherein the capacitor of the second termination circuit is a first capacitor,
wherein the second termination circuit further comprises a second capacitor,
wherein the first capacitor of the second termination circuit has a first end connected to the second end of the first transmission line and a second end connected to a first end of the second capacitor of the second termination circuit,
wherein a second end of the second capacitor of the second termination circuit is connected to the second end of the second transmission line, and
wherein the inductor of the second termination circuit has a first end connected to a node between the first capacitor of the second termination circuit and the second capacitor of the second termination circuit, and a second end connected to ground.

20. The power amplifier circuit according to claim 3,
wherein the inductor of the second termination circuit is a first inductor,
wherein the second termination circuit further comprises a second inductor,
wherein the first inductor of the second termination circuit has a first end connected to the second end of the first transmission line and a second end connected to a first end of the second inductor of the second termination circuit,
wherein a second end of the second inductor of the second termination circuit is connected to the second end of the second transmission line, and
wherein the capacitor of the second termination circuit has a first end connected to a node between the first inductor of the second termination circuit and the second inductor of the second termination circuit, and a second end connected to ground.

* * * * *